(12) United States Patent
Hauf et al.

(10) Patent No.: US 12,370,790 B2
(45) Date of Patent: ***Jul. 29, 2025

(54) EJECTION CONTROL USING SUBSTRATE ALIGNMENT FEATURES AND PRINT REGION ALIGNMENT FEATURES

(71) Applicant: Kateeva, Inc., Newark, CA (US)

(72) Inventors: Christopher R. Hauf, Belmont, CA (US); Eli Vronsky, Los Altos, CA (US); Alexander Sou-Kang Ko, Santa Clara, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/435,326

(22) Filed: Feb. 7, 2024

(65) Prior Publication Data

US 2024/0173961 A1 May 30, 2024

Related U.S. Application Data

(63) Continuation of application No. 18/179,703, filed on Mar. 7, 2023, now Pat. No. 11,945,219, which is a
(Continued)

(51) Int. Cl.
*B41J 2/045* (2006.01)

(52) U.S. Cl.
CPC ........ *B41J 2/04505* (2013.01); *B41J 2/04586* (2013.01)

(58) Field of Classification Search
CPC ...... B41J 2/04505; B41J 2/04586; B41J 3/28; B41J 3/407; B41J 11/008; B41J 11/46;
(Continued)

(56) References Cited

U.S. PATENT DOCUMENTS 6,335,978 B1 1/2002 Moscato et al.
8,079,662 B2 12/2011 Nakajima et al.
(Continued)

FOREIGN PATENT DOCUMENTS

JP 2004281983 A 10/2004
JP 2008304612 A 12/2008

OTHER PUBLICATIONS

EP Supplementary European Search Report issued Aug. 18, 2022 for EP Patent Application No. 19900654.5.
(Continued)

*Primary Examiner* — Kristal Feggins
(74) *Attorney, Agent, or Firm* — Hauptman Ham, LLP

(57) ABSTRACT

In a printing method, at least one image of a substrate supported in a printing system is acquired. An actual position of a first alignment feature on the substrate in a frame of reference of the printing system is determined based on the at least one image. Expected positions of second alignment features on the substrate are determined based on the actual position of the first alignment feature. Actual positions of the second alignment features in the frame of reference of the printing system are determined based on the at least one image and the expected positions of the second alignment features. Target positions of print regions on the substrate are determined based on the actual positions of the second alignment features. Ejection of print material onto the substrate in the print regions is controlled based on the target positions of the print regions.

20 Claims, 14 Drawing Sheets

Related U.S. Application Data continuation of application No. 17/445,907, filed on Aug. 25, 2021, now Pat. No. 11,628,666, which is a continuation of application No. 16/716,143, filed on Dec. 16, 2019, now Pat. No. 11,135,835.

(60) Provisional application No. 62/891,807, filed on Aug. 26, 2019, provisional application No. 62/782,442, filed on Dec. 20, 2018.

(58) Field of Classification Search
CPC . B41J 2/125; B41J 2/13; B41J 2/04503; B41J 2/04508; B41J 2/0459; B41J 2/04591; B41J 2/04598; B41J 2/04596; H10K 71/135; H10K 71/70
See application file for complete search history.

(56) References Cited

U.S. PATENT DOCUMENTS

| | | | |
|---|---|---|---|
| 11,135,835 B2 | 10/2021 | Hauf | |
| 11,628,666 B2 | 4/2023 | Hauf et al. | |
| 11,945,219 B2* | 4/2024 | Hauf | B41J 3/28 |
| 2006/0257615 A1 | 11/2006 | Takano et al. | |
| 2008/0170089 A1 | 7/2008 | Albertalli et al. | |
| 2010/0258789 A1 | 10/2010 | Akai et al. | |
| 2012/0032142 A1 | 2/2012 | Leatherdale et al. | |
| 2014/0204319 A1 | 7/2014 | Cai | |
| 2014/0367633 A1 | 12/2014 | Bibl et al. | |
| 2015/0281654 A1 | 10/2015 | Miyazaki et al. | |
| 2015/0301408 A1 | 10/2015 | Li | |
| 2018/0008995 A1 | 1/2018 | Baker et al. | |
| 2018/0083230 A1 | 3/2018 | Harjee et al. | |
| 2018/0102449 A1 | 4/2018 | Pschenitzka et al. | |
| 2018/0229497 A1 | 8/2018 | Darrow et al. | |

OTHER PUBLICATIONS

Non-Final Office Action issued Aug. 8, 2023 in U.S. Appl. No. 18/179,703.
Non-Final Office Action issued Feb. 4, 2021 to U.S. Appl. No. 16/716,143.
Non-final Office Action issued Sep. 9, 2022 in U.S. Appl. No. 17/445,907.
Notice of Allowance issued Jan. 6, 2023 in U.S. Appl. No. 17/445,907.
Notice of Allowance issued May 26, 2021 to U.S. Appl. No. 16/716,143.
Notice of Allowance issued Nov. 13, 2023 in U.S. Appl. No. 18/179,703.
Notification of Transmittal of the International Search Report and the Written Opinion of the International Searching Authority, mailed Mar. 3, 2020, for International Patent Application No. PCT/US19/67161.

* cited by examiner

EJECTION CONTROL USING SUBSTRATE ALIGNMENT FEATURES AND PRINT REGION ALIGNMENT FEATURES

CROSS-REFERENCE TO RELATED APPLICATIONS

This application is a continuation of U.S. patent application Ser. No. 18/179,703, filed Mar. 7, 2023, which is a continuation of U.S. patent application Ser. No. 17/445,907, filed Aug. 25, 2021, now U.S. Pat. No. 11,528,666, issued Apr. 18, 2023, which is a continuation of U.S. patent application Ser. No. 16/716,143, filed Dec. 16, 2019, now U.S. Pat. No. 11,135,835, issued Oct. 5, 2021, which claims the benefit of United States Provisional Patent Application No. 62/782,442, filed Dec. 20, 2018, and Application No. 62/891,807 filed Aug. 26, 2019, each of which is incorporated by reference herein.

FIELD

Embodiments of the present application generally relate to inkjet printing systems. Specifically, methods, systems and/or apparatuses for ejection control in inkjet printing systems are described.

BACKGROUND

Inkjet printing is common, both in office and home printers and in industrial scale printers used for fabricating displays, printing large scale written materials, adding material to manufactured articles such as PCBs, and constructing biological articles such as tissues. Some printing applications, such as printing light emitting materials on a display substrate, rely on extreme precision in positioning of dispensing nozzles and/or print substrates. In some cases, error of more than about 15 μm in placement of a droplet of print material can cause a printing fault. Achieving such extreme precision is complicated by myriad factors, such as manufacturing tolerances of printer components, thermal expansion, thermal non-uniformity, vibration, and evolution of printer component properties over time. Variation in substrate preparation can also introduce errors. In particular, prior to printing light-emitting materials onto a display substrate, the locations for the light-emitting materials are sometimes printed onto the substrate. Variation, or error, in printing the locations can lead to, and compound, error in printing the light-emitting materials. Methods, systems and/ or apparatuses for controlling ejection of print material in an inkjet printer are proposed in this aspect.

SUMMARY

In a printing method in accordance with one embodiment, at least one image of a substrate supported in a printing system is acquired. An actual position of a first alignment feature on the substrate in a frame of reference of the printing system is determined based on the at least one image. Expected positions of a plurality of second alignment features on the substrate are determined based on the actual position of the first alignment feature. Actual positions of the plurality of second alignment features in the frame of reference of the printing system are determined based on the at least one image and the expected positions of the second alignment features. Target positions of a plurality of print regions on the substrate are determined based on the actual positions of the second alignment features. Ejection of print material onto the substrate in the plurality of print regions is controlled based on the target positions of the print regions.

In one embodiment, a printing system comprises a substrate support configured to support a substrate, a printhead assembly having dispensing nozzles, at least one imaging device, and a controller. The controller is configured to control the at least one imaging device to capture first images of a plurality of first alignment features on the substrate. The controller is further configured to determine actual positions of the first alignment features in a frame of reference of the printing system, based on the first images. The controller is further configured to determine expected positions of a plurality of second alignment features based on the actual positions of the plurality of first alignment features. The controller is further configured to control relative positioning of the at least one imaging device and the substrate support based on the expected positions of the second alignment features to enable imaging of the second alignment features using the at least one imaging device. The controller is further configured to control the at least one imaging device to capture second images of the second alignment features. The controller is further configured to determine actual positions of the second alignment features in the frame of reference of the printing system, based on the second images. The controller is further configured to determine target positions of print regions corresponding to groups of the second alignment features based on the actual positions of the second alignment features. The controller is further configured to control ejection of print material from the dispensing nozzles of the printhead assembly onto the substrate in the print regions, based on the target positions of the print regions.

In one embodiment, a controller for a printing system comprises at least one processor. The processor is configured to receive image data of at least one of a plurality of alignment features on a substrate supported for a print job in the printing system. The processor is further configured to determine actual positions of the plurality of alignment features in a frame of reference of the printing system, based on the image data. The processor is further configured to determine target positions of pixels at corners of a print region on the substrate, based on the actual positions of the plurality of alignment features. The processor is further configured to determine target positions of pixels along edges of the print region, based on the target positions of the pixels at the corners of the print region. The processor is further configured to determine target positions of pixels in the print region, based on the target positions of the pixels along the edges of the print region. The processor is further configured to control ejection of print material from dispensing nozzles of a printhead assembly of the printing system onto the print region of the substrate, based on the target positions of the pixels in the print region.

In one embodiment, a flat panel display is made by a printing method in which at least one image of a substrate supported in a printing system is acquired. An actual position of a first alignment feature on the substrate in a frame of reference of the printing system is determined based on the at least one image. Expected positions of a plurality of second alignment features on the substrate are determined based on the actual position of the first alignment feature. Actual positions of the plurality of second alignment features in the frame of reference of the printing system are determined based on the at least one image and the expected positions of the second alignment features. Target positions of a plurality of print regions on the substrate are determined based on the actual positions of the second alignment features. Ejection of print material onto the substrate in the plurality of print regions is controlled based on the target positions of the print regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
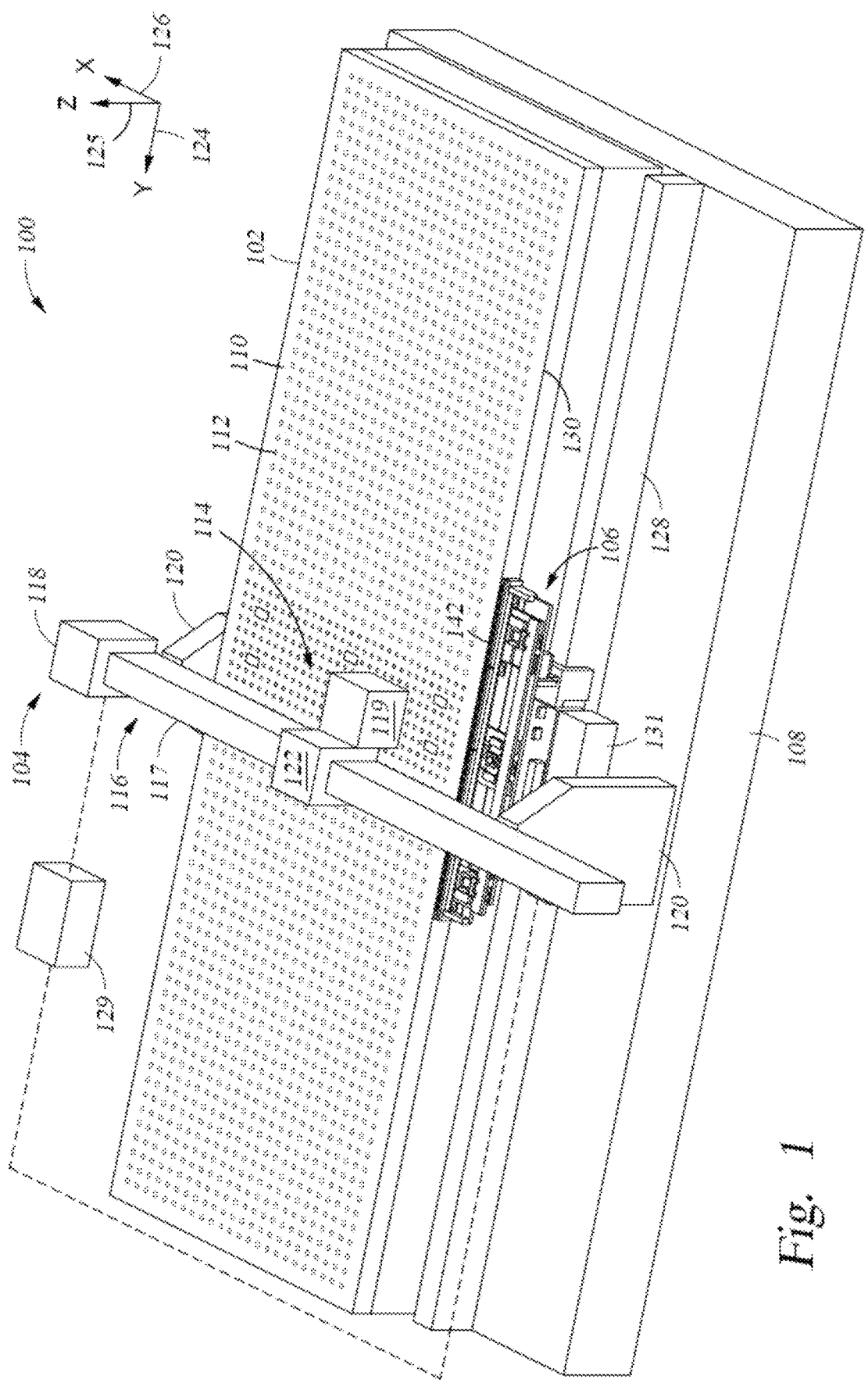
FIG. 1 is a top isometric view of a printing system.

The following disclosure provides many different embodiments, or examples, for implementing different features of the provided subject matter. Specific examples of components, values, operations, materials, arrangements, etc., are described below to simplify the present disclosure. These are, of course, merely examples and are not intended to be limiting. Other components, values, operations, materials, arrangements, etc., are contemplated. For example, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

High precision in positioning of dispensing nozzles and/or print substrates is relied on in some inkjet printing applications to obtain printed products of high quality. In order to precisely dispense print material onto a substrate at very small target locations using an inkjet printing system, it is useful to determine the actual positions of the substrate and/or print regions thereof in a frame of reference of the inkjet printing system. The actual positions of the print regions, defined in the frame of reference of the printing system, are then used for printing with high precision. The actual positions of the print regions are determined based on one or more print region alignment features on the substrate. Actual positions of the print region alignment features are, in turn, determined based on one or more substrate alignment features. As a result, in at least one embodiment, the actual positions of all print regions on the substrate may be determined in a single frame of reference of the printing system, and a single "firing" plan for a print job to print in all print regions on the substrate may be developed while permitting for substrate fabrication and/or printer measurement errors. Therefore, printing speed and accuracy are improved. This arrangement is advantageous over other approaches in which a limited set of marks are provided for determining the position of a substrate, without a separate set of marks for determining positions of individual print regions, and therefore, without the capability to correct for errors among the print regions on the substrate.

FIG. 1 is a top isometric view of a printing system 100. The printing system 100 has a substrate support 102, a print assembly 104, and a holder assembly 106 for manipulating a substrate for printing. The printing system 100 is founded upon a base 108, which is in one example a massive object to minimize vibratory transmissions to the operative parts of the printing system 100. In one example, the base 108 is a granite block. The substrate support 102 is located upon the base 108, and comprises a support surface 110 along with a device for making the support surface 110 substantially frictionless. In one example, the support surface 110 is an air table that provides a gas cushion on which the substrate floats. The support surface 110 features a plurality of holes 112 that allow jets of gas to exit, thus providing an upward force to maintain a substrate at a desired elevation above the support surface 110. Some of the holes are configured to also allow controlled withdrawal of gas from the gas cushion floating the substrate to provide precise local control of substrate elevation.

The print assembly 104 comprises a dispenser assembly 114 disposed on a print support 116. The print support 116 is disposed in relation to the substrate support 102 to provide access for the dispenser assembly 114 to position constructively in relation to a substrate on the substrate support 102 to precisely apply print material to the substrate. The print support 116 includes a rail or beam 117 that traverses the substrate support 102, allowing the dispenser assembly 114 to traverse the substrate support 102 and deposit print material at any location on the substrate from one side of the print support 116 to the opposite side thereof. In one example, the print support 116 is attached to the base 108 and extends from the base 108 to provide stable support for the dispenser assembly 114. Two stands 120 extend from the base 108, on opposite sides of the substrate support 102, to the rail 117, which extends across the substrate support 102. In one example, the stands 120 and the rail 117 are both made of the same material as the base 108. In one example, the stands 120, the rail 117, and the base 108 are integrally formed from one piece of granite.

The dispenser assembly 114 includes at least one printhead assembly 119 along with a print assembly controller 118 that includes electronics and/or sensors for controlling the functional parameters of the printhead assembly 119 such as location of the printhead assembly 119 along the print support 116, timing, duration, type of print material, and dispensing profile. The printhead assembly 119 is movable along the rail 117 of the print support 116 by operation of a print carriage 122 that couples with the print support 116 to translate the printhead assembly 119 along the rail 117 from one end of the rail 117 to the other opposite end. In one example, the print carriage 122 is driven by a motor or a servomotor. Power and signal conduits are omitted to simplify the figure.

A substrate (not shown in FIG. 1) is positioned under the print assembly 104 by the holder assembly 106. The holder assembly 106 acquires secure contact with the substrate upon loading and moves the substrate along the substrate support 102 to position the substrate with respect to the print assembly 104 for dispensing print material onto the substrate in a precise fashion. The holder assembly 106 is located on one side of the substrate support 102 and extends along the substrate support 102 in a first direction to translate the substrate in the first direction during printing. The first direction is denoted in FIG. 1 by arrow 124. The first direction 124 is sometimes referred to as the "Y direction" or "scan direction." The printhead assembly 119 moves in a second direction substantially transverse to the first direction, guided by the rail 117 which extends substantially in the second direction denoted in FIG. 1 by arrow 126. The second direction 126 is sometimes referred to as the "X direction" or "cross-scan direction," and the rail 117 as the "X beam." A third direction substantially transverse to the first and second directions is denoted in FIG. 1 by arrow 125. The third direction 125 is referred to as the "Z direction." The X, Y and Z directions are directions of axes of a coordinate system serving as a frame of reference of the printing system 100, as illustrated by the arrows 124, 125, and 126. In one example, the origin of the coordinate system is at a fixed point, e.g., associated with the base 108 or a home position of the dispenser assembly 114.

The holder assembly 106 is disposed on a holder assembly support 128, which in one example is a rail that extends in the first direction substantially the entire length of the substrate support 102 along an edge 130 of the substrate support 102. In one example, the holder assembly support 128 is attached to the base 108 to provide stable support for the holder assembly 106. In one example, the holder assembly support 128 is made from the same material as the base 108. In one example, the holder assembly support 128, base 108, and print support 116 are integrally formed from one piece of granite. The holder assembly support 128 is referred to as a "Y beam." The holder assembly 106 moves along the holder assembly support 128 during operation to position the securely held substrate at any location on the substrate support 102, and the print assembly 104, for example by operation of the print assembly controller 118, positions the printhead assembly 119 to provide access to a precise location on the substrate for dispensing print material.

A system controller 129 receives signals from various sensors deployed throughout the printing system 100 and sends signals to various components of the printing system 100 to control printing. The system controller 129 is operationally coupled, for example, via a network, to the print assembly controller 118 and to a holder assembly controller 131, which controls operation of the holder assembly 106. One or more of the substrate support 102, the print assembly 104, the holder assembly 106, and other ancillary systems, such as environment control and materials management systems, have sensors operatively coupled to the system controller 129 to transmit signals to the system controller 129 related to the status of various components during a printing operation. The system controller 129 includes data and instructions to determine control signals to send to various controlled components of the printing system 100. In one embodiment, two or more of the system controller 129, the print assembly controller 118 and the holder assembly controller 131 are integrated into a single controller. In one embodiment, at least one of the system controller 129, the print assembly controller 118 and the holder assembly controller 131 is implemented as several controllers distributed in the printing system 100 and connected one with another via a network. An example configuration of a controller in accordance with one embodiment is described with respect to FIG. 7. For simplicity, in the description below, "controller" refers to any one or more of controllers in the printing system 100.

To perform precision inkjet printing, microscopic droplets of print material are placed in correspondingly small areas of the substrate. For example, in some cases print material droplets having diameter of 5-10 µm are placed in an area of the substrate of dimension 10-15 µm. This is often done while the substrate is moving in the Y direction (scan direction) to minimize print time. Such extreme precision is complicated by many factors, such as tiny imperfections in the dimensions and/or positions of the various parts of the printing system 100, variation of those dimensions with temperature, imprecision in the substrate, imprecision in speed of translation of the substrate, the dispenser assembly 114, and the holder assembly 106, and imprecision in the distance of the substrate from the printhead assembly 119. For example, if positions of the dispensing nozzles in the printhead assembly 119 in the frame of reference of the printing system 100 are not precisely known or controlled, it is difficult to control print material droplets from the dispensing nozzles in the printhead assembly 119 for the print material droplets to arrive at the target locations when the substrate is in the proper position. In some aspects, nozzle mapping is performed to determine or control positions of the dispensing nozzles in the frame of reference of the printing system 100. In further aspects, features of the substrate are recognized and also mapped to the frame of reference of the printing system 100 to compensate for any misalignment of the substrate.

Figure 2:
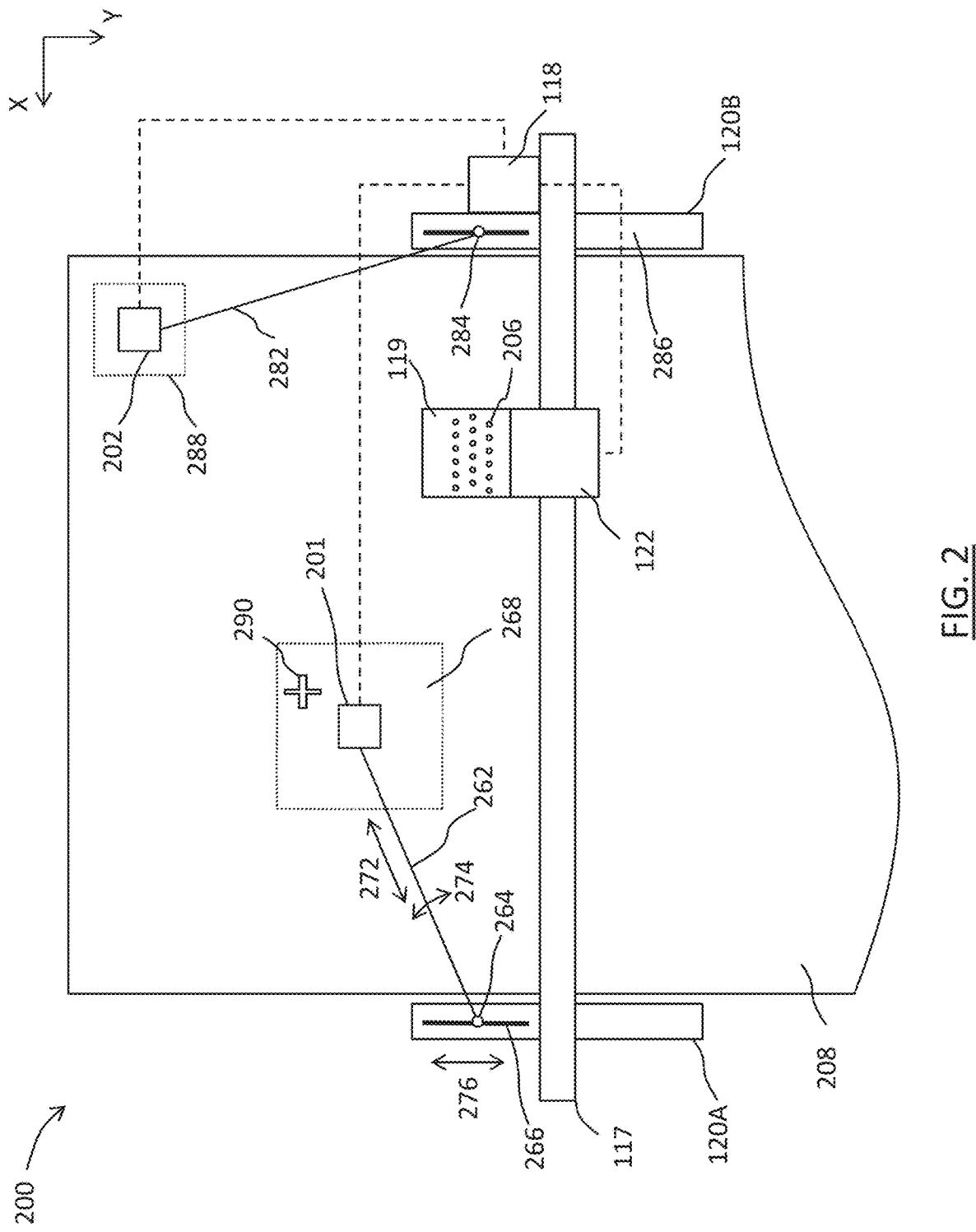
FIG. 2 is schematic top view of a printing system in accordance with one embodiment.

FIG. 2 is schematic top view of a printing system 200 in accordance with one embodiment. In one embodiment, the printing system 200 includes one or more features of the printing system 100 described herein.

The printing system 200 includes a substrate support configured to support a substrate in a manner similar to the substrate support 102 of the printing system 100. For simplicity, the substrate support is not illustrated in FIG. 2; instead, a substrate 208 supported on the substrate support is shown. The printing system 200 further includes the printhead assembly 119 having dispensing nozzles 206. In reality, the dispensing nozzles 206 may not be visible in a top plan view like FIG. 2, and a representation of dispensing nozzles is shown in FIG. 2 for illustrative purposes. The circles represented as the dispensing nozzles 206 are shown on a top surface of the printhead assembly 119, when in fact the dispensing nozzles 206 are physically located on a nozzle surface (not visible) of the printhead assembly 119 opposite the top surface visible in FIG. 2. Thus, the circles representing the dispensing nozzles 206 show the positions of dispensing nozzles 206 on the nozzle surface opposite the visible top surface. The printing system 200 also includes the controller 118 and at least one imaging device coupled to the controller 118.

In the example configuration in FIG. 2, the printing system 200 includes two imaging devices, i.e., a first imaging device 201 and a second imaging device 202. In an example, each of the first imaging device 201 and second imaging device 202 includes a camera having an array of image sensors arranged in multiple columns and rows to capture image data. Examples of image sensors include, but are not limited to, CMOS (complementary metal oxide semiconductor) and CCD (charge coupled device) sensors. The first imaging device 201 has a first, lower resolution and a wider field of view 268. The second imaging device 202 has a second, higher resolution and a narrower field of view 288. The described arrangement of the imaging devices is an example. Other configurations are within the scopes of various embodiments. In other examples, a single imaging device maybe sufficient for image capturing described herein, provided that the imaging device has a sufficiently wide field of view and/or a sufficiently high resolution. In other examples, an imaging device having an adjustable field of view and/or an adjustable resolution is used.

At least one of the first imaging device 201 or second imaging device 202 is movable relative to the substrate support, and therefore, movable relative to the substrate 208 supported on that substrate support. For example, the first imaging device 201 is mounted at a distal end of an arm 262 which has its proximal end attached to a pivot 264. The pivot 264 is mounted on and slidable along a rail 266 supported by one of the stands 120, i.e., stand 120A. The arm 262 may be telescopically extendible or retractable to adjust its length as shown by arrow 272. The arm 262 is further rotatable about the pivot 264 as shown by arrow 274, and the proximal end of the arm 262 is movable along the rail 266 as shown by arrow 276. Likewise, the second imaging device 202 is mounted at a distal end of an arm 282 which has its proximal end attached to a pivot 284. The pivot 284 is mounted on and slidable along a rail 286 supported by the other of the stands 120, i.e., stand 120B. The arm 282 may be telescopically extendible or retractable to adjust its length. The described arrangement for moving the first imaging device 201 and/or the second imaging device 202 is an example. Other configurations are within the scopes of various embodiments.

The movement of the first imaging device 201 and/or second imaging device 202 relative to the substrate 208 is controlled by the controller 118 via precise positioning devices, such as servo motors. As a results, actual positions of the first imaging device 201 and/or second imaging device 202 in the frame of reference of the printing system 200 are known to the controller 118, and may be used by the controller 118 to determine actual positions of one or more marks recognized from images captured by the first imaging device 201 and/or second imaging device 202.

In an example, the first imaging device 201 with its larger field of view 268 may be used first to capture a wide-area, intermediate image of the substrate 208 so as to increase the likelihood that a mark 290 on the substrate 208 may be included in the intermediate image. Based on the captured wide-area image, the controller 118 recognizes the mark 290, using a known algorithm as described herein. The actual position of the recognized mark 290 is determined based on at least the actual position of the first imaging device 201 at the time the wide-area image was captured. However, due to the lower resolution of the first imaging device 201, the actual position of the recognized mark 290 determined based the wide-area image of such a lower resolution may not be sufficiently accurate in some situations. In such cases, the second imaging device 202 with the higher resolution is moved under control of the controller 118 to the position of the mark 290 determined from the wide-area image to capture another, high-resolution image, which permits the actual position of the mark 290 in the frame of reference of the printing system to be determined at higher accuracy. The actual position of the mark 290 is then used for determining the actual positions of one or more print regions on the substrate 208, as described herein. The high accuracy at which the actual position of the mark 290 is determined contributes to high print precision.

In a further example, the second imaging device 202 may be moved under control of the controller 118 so that an expected position of the mark 290 may fall within the field of view 288 of the second imaging device 202. The expected position (or preset position) of the mark 290 is known, e.g., from design data supplied to the printing system 200 for a print job to print on the substrate 208. In an example, the design data includes the ideal or expected positions, in the frame of reference of the printing system, of features consistent with the ideal or expected position information used for the fabrication of the previous layers (e.g., a black matrix) on the substrate. The ideal or expected positions may be obtained from a CAD (Computer-Aided Design) drawing used for the fabrication of the substrate.

If the mark 290 is indeed present within the narrower field of view 288 of the second imaging device 202, the mark 290 may be recognized from a high-resolution image captured by the second imaging device 202 and the actual position of the mark 290 may be determined at high accuracy, without capturing another image, based on at least the actual position of the second imaging device 202 at the time the high-resolution image was captured. However, if, due to substrate fabrication or mark installation errors, the mark 290 was not present within the narrower field of view 288 of the second imaging device 202 and, as a result was not recognized from the high-resolution image captured by the second imaging device 202, the first imaging device 201 with its wider field of view 268 will be moved in to capture an intermediate wide-area image for identifying the mark 290 before the second imaging device 202 is used again for precise determination of the actual position of the mark 290, as described above.

The above described sequence of using two imaging devices to capture multiple images of marks is an example. In other examples, a single imaging device with an adjustable field of view and/or an adjustable resolution, e.g., with zooming capability, may be used instead of multiple imaging devices, for capturing both wide-area and high-resolution images. In another example, a single image that both has a high resolution and covers a wide area of the substrate may be sufficient for high-precision mark acquisition, without requiring multiple images, as described with respect to FIGS. 3A-3B below.

Figure 3A:
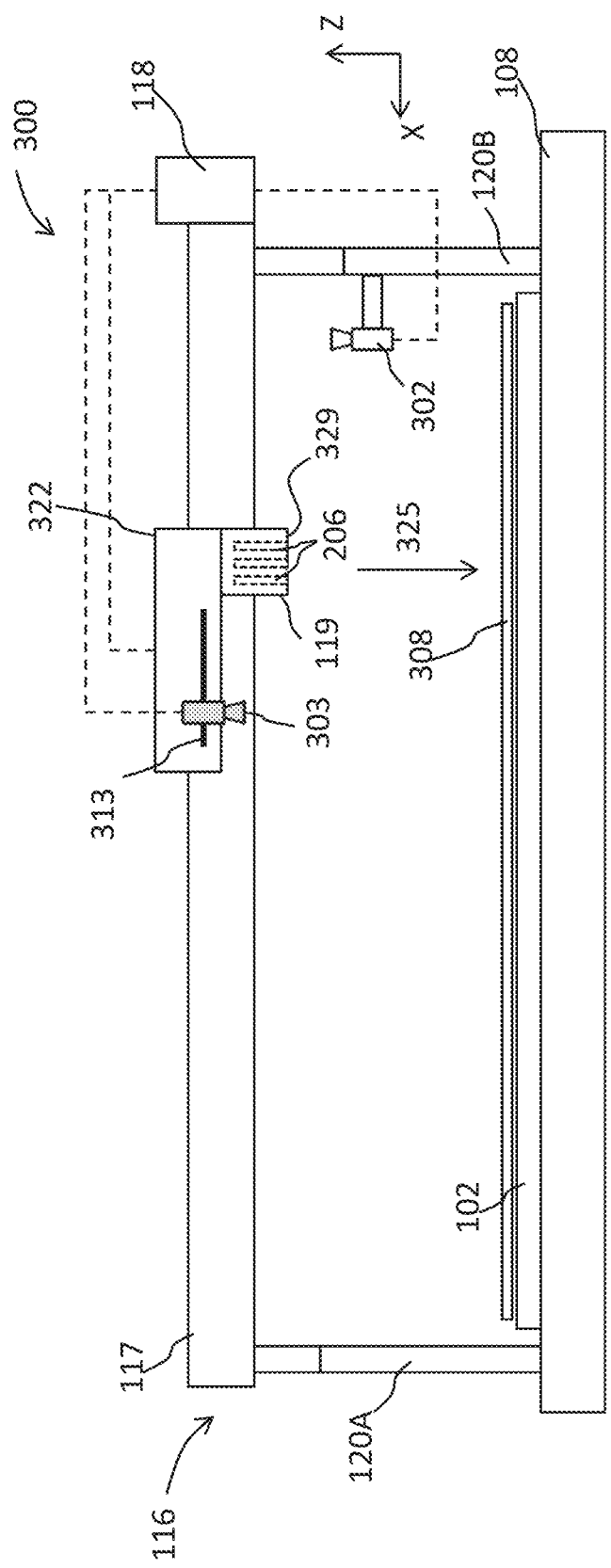
FIG. 3A is a schematic side view of a printing system in accordance with one embodiment.
Figure 3B:
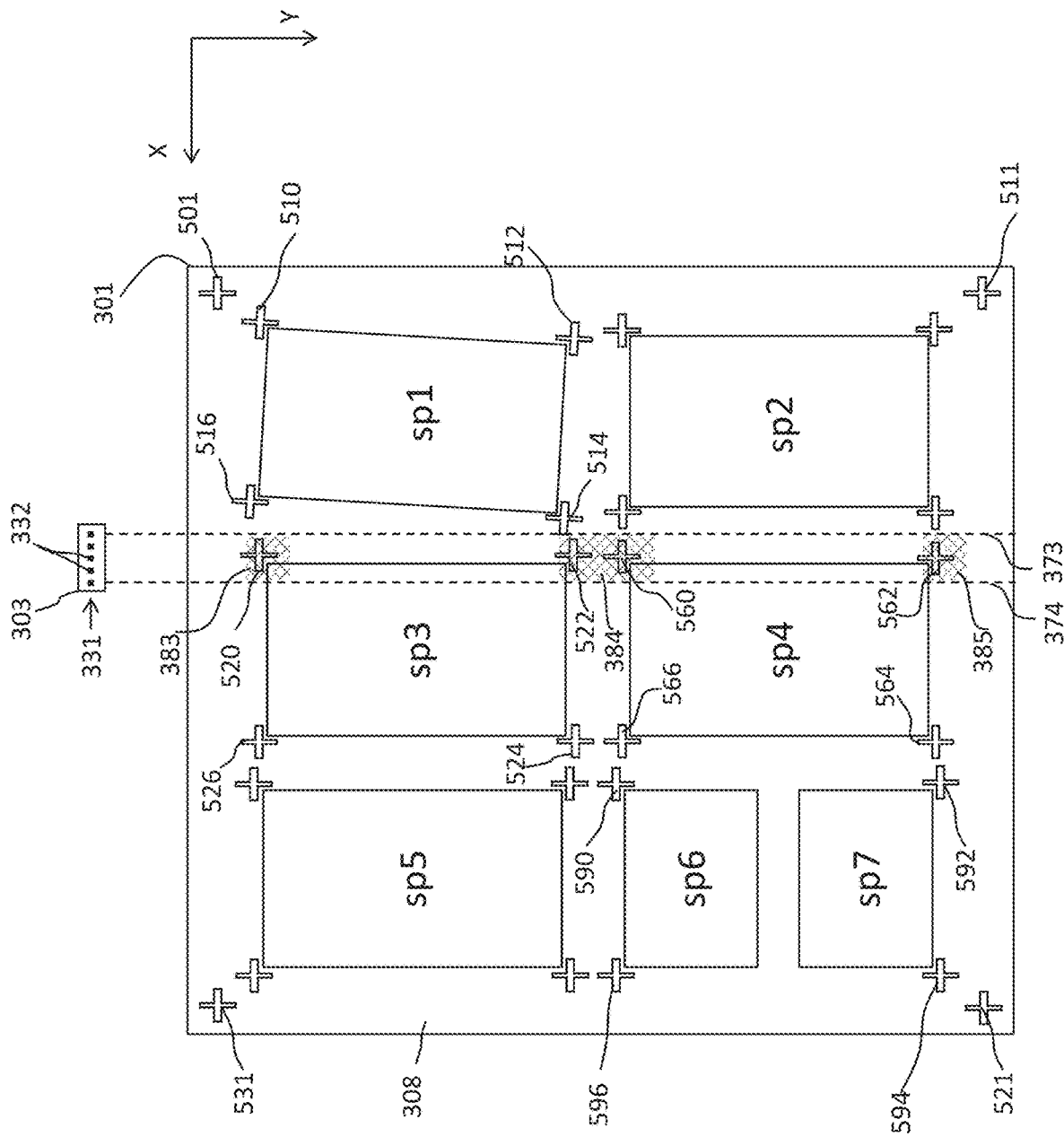
FIG. 3B is a schematic top view of a substrate in the printing system of FIG. 3A in an example.

FIG. 3A is a schematic side view of a printing system 300 in accordance with one embodiment. FIG. 3B is a schematic top view of a substrate 308 in the printing system 300 of FIG. 3A in an example. In one embodiment, the printing system 300 includes one or more features of the printing system 100 and the printing system 200 described herein. Compared to the printing system 200 where one or more imaging devices each having an array of image sensors arranged in multiple columns and rows, the printing system 300 includes at least one line scan imager having image sensors arranged in a line. A printing system can use both an imaging device with an array of image sensors as described with respect to FIG. 2 and a line scan imager with a line of image sensors as described with respect to FIGS. 3A-3B.

As shown in FIG. 3A, the printing system 300 comprises the substrate support 102, the printhead assembly 119, and a line scan imager 303. The printhead assembly 119 is movably coupled to the print support 116, and is positioned facing the substrate support 102. The line scan imager 303 is coupled to the print support 116 or the printhead assembly 119, and is also positioned facing the substrate support 102. The line scan imager 303 is movable along the print support 116.

The printhead assembly 119 comprises dispensing nozzles 206 extending towards the substrate support 102. The printhead assembly 119 and the line scan imager 303 are positioned facing the substrate support 102 in an ejection direction 325 in which print material is to be ejected from the dispensing nozzles 206 of the printhead assembly 119 onto a substrate 308 supported on the substrate support 102. Here, the printhead assembly 119 is coupled with the rail 117 by an air bearing assembly or other low friction coupling means (not shown), and a linear actuator including, for example, a motor or other driver and coupled between the printhead assembly 119 and one or both of the stands 120A, 120B moves the printhead assembly 119 in the cross-scan direction. The line scan imager 303 is coupled to the print carriage 322 that carries the printhead assembly 119, and is therefore moveable together with the printhead assembly 119 along the rail 117 of the print support 116 relative to the substrate support 102. The line scan imager 303 is coupled to a rail 313 supported by the print carriage 322 to be moved along the rail 313 by, for example, a motor or a servomotor. As a result, movement of the line scan imager 303 along the print support 116 can be controlled, for example, by the controller 118, to be effected by movement of the printhead assembly 119 along the print support 116, or by movement of the line scan imager 303 along the rail 313 relative to the printhead assembly 119, or both. In another example, the line scan imager 303 is fixed to the print carriage 322 and is movable along the print support 116 by movement of the print carriage 322 and the printhead assembly 119. In another example, the line scan imager 303 is coupled to the print support 116 to be movable independently of the printhead assembly 119. In another example, more than one line scan imager like the line scan imager 303 is included in the printing system 300 to capture multiple images during a single pass of the substrate 308 in the Y direction under the line scan imagers.

The line scan imager 303 is configured to capture at least one image including at least one mark on the substrate 308. The line scan imager 303 converts the image to data or signals that are transmitted to the controller 118, or another controller (e.g. the system controller 129 of FIG. 1) of the printing system 300. The controller 118 receives the signals, which are converted to image data, or the image data from the line scan imager 303. From the image data, the controller 118 determines the actual position of the at least one mark, as described with respect to FIG. 2. The actual position of the mark is then used for determining the actual positions of one or more print regions on the substrate 308, as described herein. This print region determination is a process that enables controlling the printing system 300 to print with high precision. Another optional process that helps involves nozzle mapping. For nozzle mapping, the printing system 300 includes an imaging device 302 oriented in the Z direction opposite to the ejection direction 325 for capturing at least one image including a plurality of marks on a bottom surface (or nozzle surface) 329 of the printhead assembly 119. The captured image is transferred to the controller 118, or another controller of the printing system 300, which is coupled to the imaging device 302 as shown in FIG. 3A. The marks on the nozzle surface 329 the printhead assembly 119 are recognized, e.g., by the controller 118, from the image transferred from the imaging device 302 for mapping positions of the dispensing nozzles 206 to the frame of reference of the printing system 300. The mapped positions (or actual positions) of the one or more print regions of the substrate 308 and the mapped positions of the dispensing nozzles 206 in the same frame of reference are used for controlling ejection of the print material from the dispensing nozzles 206 onto the one or more print region of the substrate 308. Because the mapped positions of the dispensing nozzles 206 and the one or more print regions reflect the actual positions of the dispensing nozzles 206 and the one or more print regions with high accuracy, printing accuracy is improved. In an example configuration, the imaging device 302 for nozzle mapping is a line scan imager which captures an image including the nozzle surface 329 of the printhead assembly 119 while the printhead assembly 119 passes by the imaging device 302 in the scan direction (X direction). In at least one embodiment, the imaging device 302 is omitted.

FIG. 3B is a schematic plan view of the substrate 308 in the printing system 300 of FIG. 3A in an example. More specifically, FIG. 3B shows a combined view of a top plan view of the substrate 308 (as seen downward in the ejection direction 325 in FIG. 3A) placed side-by-side with a bottom plan view of a bottom surface of the line scan imager 303 (as seen upward in the Z direction in FIG. 3A) for comparison.

The line scan imager 303 comprises a plurality of image sensors 332. In the example configuration in FIG. 3B, all image sensors 332 of the line scan imager 303 are arranged in a single line, e.g., line 331, along the cross-scan direction (X direction). In another embodiment (not shown), the image sensors 332 of the line scan imager 303 are arranged in more than one lines. For example, the image sensors 332 in a first line are configured as primary image sensors for capturing image data, whereas image sensors 332 in a second line can be configured as redundancy or secondary sensors for providing image data in case one or more primary image sensors fail, or additional sensors for improving signal-to-noise ratio of the image data. The image sensors 332 are photoelectric devices that capture light reflected from the substrate 308 toward the line scan imager 303 and register electric signals in accordance with the captured light. The image sensors 332 capture an image including one or more marks on the substrate 308 as described herein, while the substrate 308 is moving under and relative to the line scan imager 303 in the scan direction (Y direction). In this aspect, the image capturing by the line scan imager 303 is similar to that performed by a copying machine or a scanner which uses a similar linear photo sensor arrangement. To capture images including marks or features having dimensions in the range of a few μm, for example, 5-10 μm, the image sensors 332 are configured to provide a high resolution of, for example, about 0.1 μm. Examples of image sensors include, but are not limited to, CMOS (complementary metal oxide semiconductor) and CCD (charge coupled device) sensors.

To capture an image using the line scan imager 303, the line scan imager 303 is controlled by the controller 118 to move in the X direction to a position where a mark to be captured may fall within the field of view of the line scan imager 303. The line scan imager 303 is then temporarily fixed in the X direction with respect to the substrate support, and the substrate 308 is moved by the substrate support in the Y direction for image capturing for capturing the mark. For example, during such movement of the substrate 308 in the Y direction, the line scan imager 303 passes over an area of the substrate 308 between lines 373, 374. The width of this area, or the distance between lines 373, 374, corresponds to a length of the line 331 of the image sensors 332 in the X direction. The controller 118 controls the line scan imager 303 to capture images of regions 383, 384, 385 (hereinafter referred to as images 383, 384, 385) between the lines 373, 374. The image 383 is captured at a location where a mark 520 is expected to be found. Similarly, the image 384 is captured at a location where marks 522 and 560 are expected to be found, and the image 385 is captured at a location where a mark 562 is expected to be found. The expected positions of the marks on the substrate 308 are included in design data supplied to the printing system for printing on the substrate 308. The design data include at least printing data of the design to be printed on the substrate 308 as coordinates in the frame of reference of the printing system. Based on the design data and prior to image capturing, the controller 118 controls movement of the line scan imager 303 in the X direction such that the expected positions of the marks to be imaged fall within the field of view of the line scan imager 303, e.g., the expected positions of the marks 520, 542, 560, 562 fall within the area between the lines 373, 374. In at least one embodiment, some of the images 383, 384, 385 are combined in a single image. For example, both marks 520, 522 may be included in a single image extending along the Y direction, and both marks 560, 562 may be included in another single image extending along the Y direction. The image(s) captured by the line scan imager 303 in the printing system 300 is/are used in a manner similar to the images captured by the first imaging device 201 and/or the second imaging device 202 of the printing system 200. However, the line scan imager 303 can capture high-resolution images that cover a wide area, depending on the size or length of the line 331 of image sensors 332 in the X direction and/or the length of the captured image/area in the Y direction. As a result, multiple image capturing in an example as described with respect to the first imaging device 201 and/or second imaging device 202 may be avoidable when the line scan imager 303 is used.

A description will be now given for the substrate 308 in FIG. 3B which will serve as an example substrate to be mapped to the frame of reference of the printing system in accordance with some embodiments, using one or more imaging devices as described with respect to the printing system 200 and/or one or more line scan imagers as described with respect to the printing system 300. In an example, the substrate 308 is a glass substrate, but other materials such as plastics or ceramics may be used in the various printers described herein.

The substrate 308 comprises at least one substrate alignment feature, and a plurality of print region alignment features. An alignment feature may be any feature that has one or more known properties, that indicates at least one of a position or an orientation of an object, and that can be captured in image data and can be recognized from the captured image data. A substrate alignment feature indicates at least one of a position or an orientation of a substrate. A print region alignment feature indicates at least one of a position or an orientation of at least one print region on the substrate. For example, alignment features may be marks, sometimes referred to as "fiducial marks," with one or more known properties such as patterns, orientations, dimensions, and positions on the substrate 308. The marks are attached to (e.g., by adhesive), or etched or machined in, or printed or painted on the substrate 308. Other manners for providing marks to a substrate may be used. Any number and/or shape and/or material and/or orientation of the marks may be used. Any of the marks may include text, bar code, company's name and/or logo. With a higher number of marks and/or more complex mark shapes, the accuracy of the positions of the print regions determined using the marks increases. Alignment features may also include features inherent to or included in the substrate 308. In an example, one or more edges and/or one or more corners of the substrate 308 may serve as alignment features. In a further example, a feature included on the substrate 308 from a previous process may serve as an alignment feature. Examples of such features include pixel wells or sub-pixel wells in a black matrix material, or other pixel or area definition, in which print material is to be deposited. Solely for the sake of simplicity, marks are used as alignment features in the following description of example embodiments.

In the example configuration in FIG. 3B, the substrate 308 includes, as substrate alignment features, one or more substrate marks 501, 511, 521, 531 arranged at corresponding one or more corners of the substrate 308. Each of the substrate marks 501, 511, 521, 531 is in a shape of a cross with a position and an orientation known from the design data. The substrate marks 501, 511, 521, 531 together precisely indicate the positions of the substrate 308 in the frame of reference of the printing system. The shape and/or size and/or number and/or orientation and/or relative position within the substrate, of the substrate marks 501, 511, 521, 531 are examples only. Other configurations are within the scopes of various embodiments. For an example, a single substrate mark, such as substrate mark 501, may be sufficient to indicate positions of the substrate 308, provided that the substrate mark 501 has a known spatial relationship with the corresponding corner 301 of the substrate 308. In a further example, an edge or corner of the substrate 308 may be used as a substrate mark. While one substrate mark may be sufficient in some situations, the accuracy of material deposition can increase when more than one substrate marks are provided on the substrate 308.

Besides the substrate marks, the substrate 308 further includes a plurality of print region marks for recognizing and mapping a plurality of print regions to the frame of reference of the printing system. For the sake of simplicity, print region marks are referred to in the following description simply as "marks." In the example configuration in FIG. 3B, the substrate 308 includes seven print regions sp1-sp7, each corresponding, for example, to a display panel to be manufactured. To identify positions of the print regions, the substrate 308 includes for each print region one or more marks. Specifically, each of the print regions sp1-sp5 are identified by a set or group of fours marks at its corners, whereas the print regions sp6 and sp7 share a common set of four marks 590, 592, 594, 596, at corners of the area where the print regions sp6 and sp7 are located. In FIG. 3B, for the sake of simplicity, reference numerals are omitted for some of the marks. Marks 510, 512, 514, 516 are provided on the substrate 308 for identifying the print region sp1, marks 520, 522, 524, 526 are provided on the substrate 308 for identifying the print region sp3, and marks 560, 562, 564, 566 are provided on the substrate 308 for identifying the print region sp4.

In some other approaches, a limited set of marks are provided for defining an entire substrate, without a separate set of marks for individual print regions. For example, some approaches may include only the substrate marks 501, 511, 521, 531 on the substrate 308, and then use the substrate marks 501, 511, 521, 531 to calculate positions of the print regions, based on substrate layout design information, with the assumption that the print regions are perfectly arranged as intended on the substrate. Such approaches may fail to account for and remedy situations where, due to, e.g., substrate fabrication errors, the print regions may not be arranged as intended. For example, as shown in FIG. 3B, the print region sp1 has placement error compared to the other print regions. Placement error can include X-Y offset, rotation, scaling, skew, and keystoning (imaging perpendicularity) error. The inaccuracies in the calculated positions of the print regions, especially those print regions with placement errors, affect the printing accuracy in the other approaches.

Figure 4:
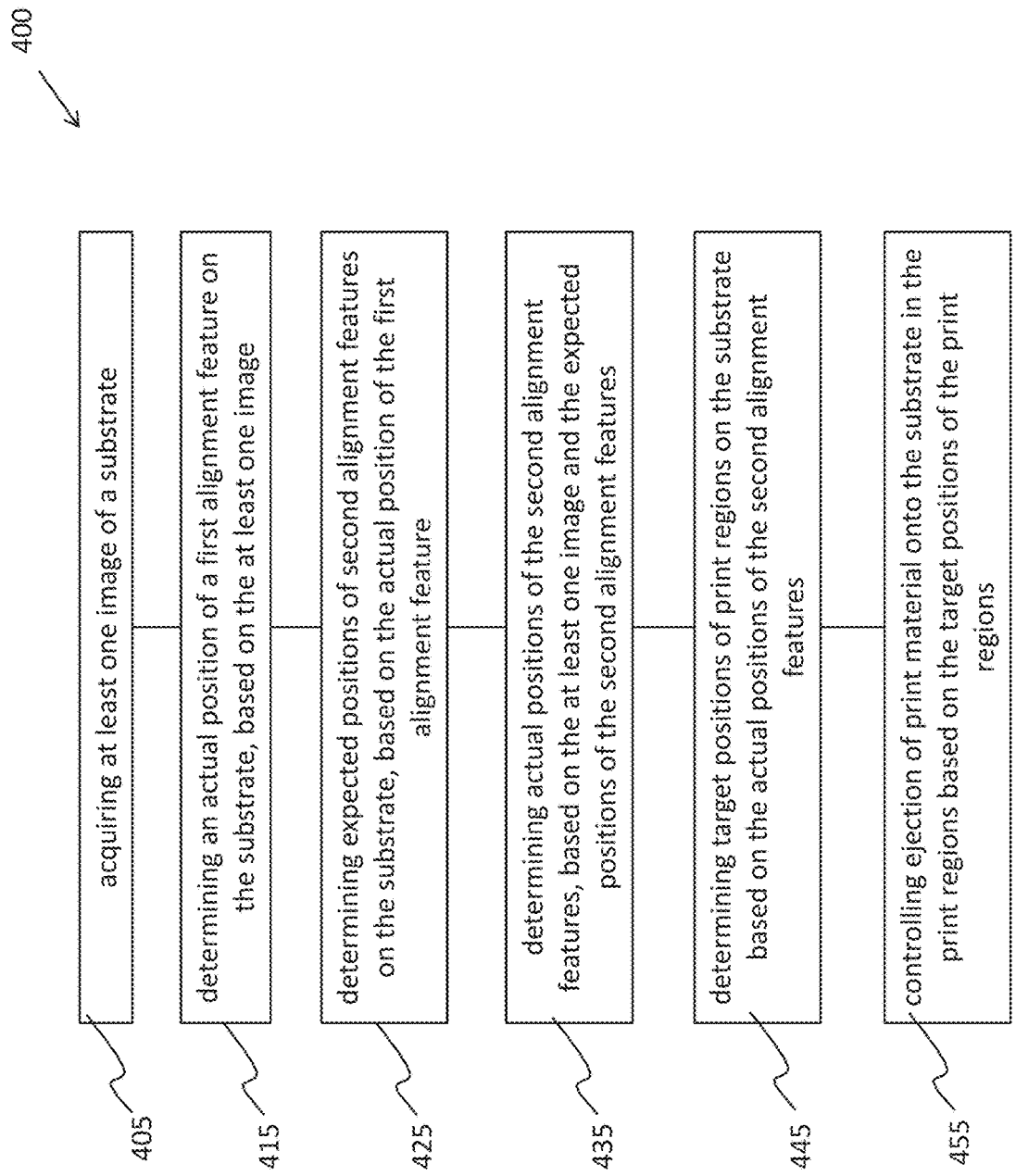
FIG. 4 is a flowchart of a printing method in accordance with one embodiment.

FIG. 4 is a flowchart of a printing method 400 in accordance with one embodiment. FIGS. 5A-5D are schematic plan views of the substrate 308 or a portion of the substrate 308 being processed at various operations of the printing method in FIG. 4. The printing method 400 may be performed in any of the printing systems 100, 200 and 300 by, or under control of, at least one controller as described herein. In the description below, the printing method 400 is performed by, or under control of, the controller 118.

At operation 405, at least one image of a substrate supported in a printing system is acquired. For example, the controller 118 acquires at least one image of the substrate 308 supported in the printing system 200 or 300 from the first imaging device 201 and/or second imaging device 202 of the printing system 200, or the line scan imager 303 of the printing system 300, respectively. The at least one image is captured at an expected position of a target mark. In the following description, the line scan imager 303 is used for image capturing.

Figure 5A:
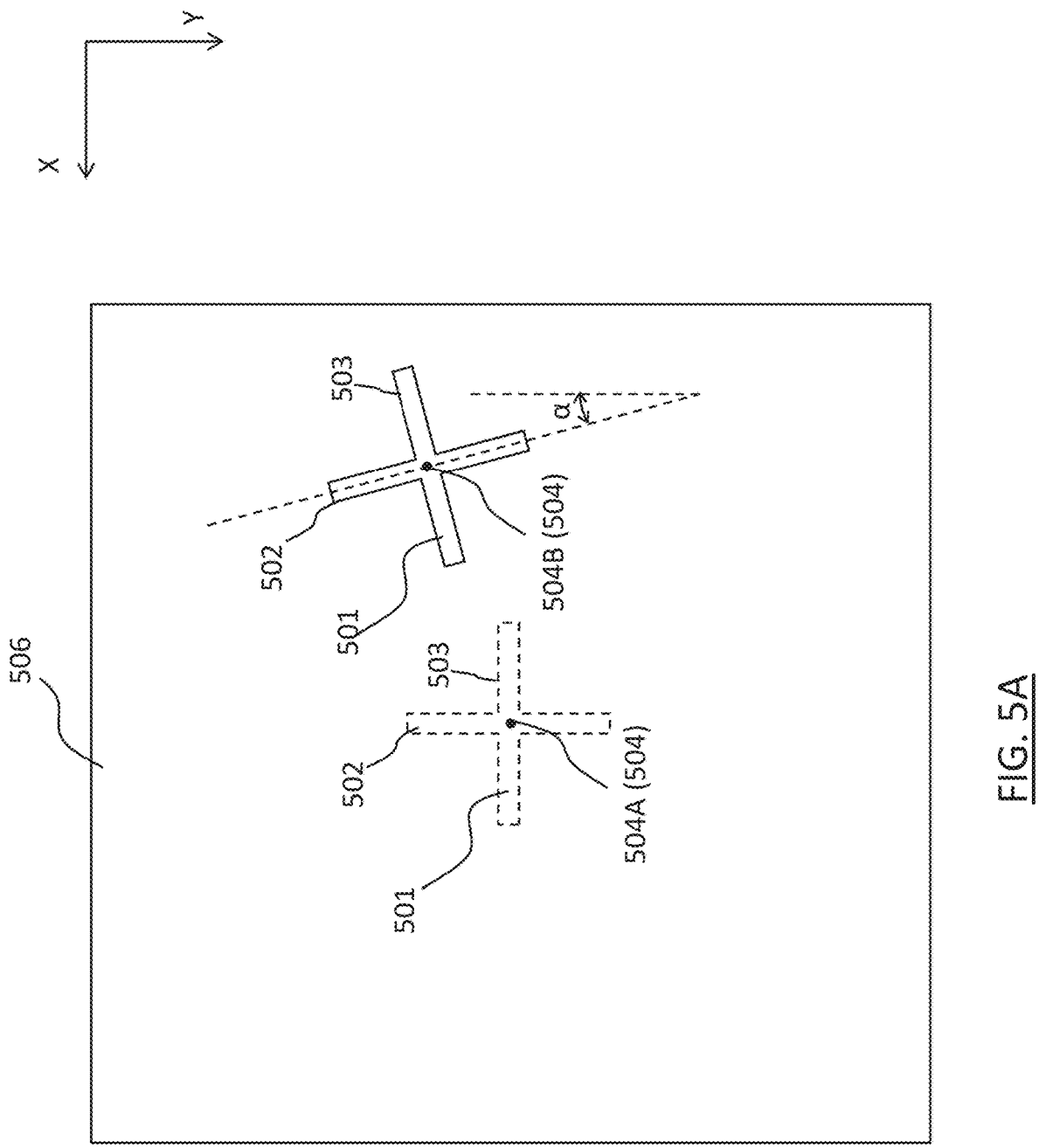
FIGS. 5A-5D are schematic plan views of a substrate or a portion of a substrate being processed at various operations of the printing method in FIG. 4.

FIG. 5A is a schematic plan view of a portion of the substrate 308 where the substrate mark 501 may be located in accordance with the design data. An image 506 of this portion of the substrate 308 is captured and transferred to the controller 118, as signals or image data, for mark recognition. According to the design data for the substrate 308, the substrate mark 501, in its expected form shown in dotted lines in FIG. 5A, has the shape of a cross. The cross is formed by a vertical element 502 and a horizontal element 503 which intersect each other at a center point 504, and which are oriented in the Y direction and X direction, respectively. The X-Y coordinates of the center point 504 in the frame of reference of the printing system are known from the design data as an expected position 504A of the substrate mark 501. The dotted line figure in FIG. 5A is shown for explanation purposes, and is not captured in the image 506. The image 506 is captured by moving the line scan imager 303 under control of the controller 118 to a location where the substrate mark 501 at its expected position may fall within the field of view of the line scan imager 303, and then the image 506 is captured. Data representing the captured image 506 is acquired or generated by the controller 118 from the transmissions of the line scan imager 303.

At operation 415, an actual position of a first alignment feature on the substrate is determined based on the at least one captured image. For example, referring to FIG. 5A, the controller 118 determines the actual position of the substrate mark 501 based on data representing the image 506. For this purpose, the controller 118 performs a mark recognition processing to recognize the substrate mark 501 from the image data, using the known properties of the substrate mark 501 included in the design data stored in and/or accessible by the controller 118. Image processing algorithms and/or software and/or programs for recognizing objects based on their known properties such as patterns, positions, sizes and/or orientations are known in the art of image processing, and are not described in detail herein.

When the substrate mark 501 is not recognizable from the captured image 506, the controller 118 controls image recapturing by the line scan imager 303. In an example, the image recapturing involves repositioning the line scan imager 303 to a new location along the X direction to better correspond to the expected position 504A of the substrate mark 501. In a further example, the image recapturing involves adjusting the resolution and/or field of view of the line scan imager 303 to image a wider area of the substrate 308. When an imaging device such as a camera is used for image capturing, image recapturing is performed as described with respect to FIG. 2. The controller 118 then performs again a mark recognition processing to recognize the substrate mark 501 from the recaptured image.

In at least one embodiment, it may not be necessary to capture the whole mark. Rather, when a portion of a mark is sufficient for determination of the mark position, capturing an image including such portion is sufficient to define an entire substrate. As such, "one or more images including one or more marks," or similar wordings, used herein does not require the whole mark to be capture in the image(s); instead, capturing a portion that permits recognition of the mark from an image of the captured portion for subsequent determination of the mark position is sufficient.

Recognizing a mark means that a controller has determined that an image, either a single image or a composite image, contains a mark. When a mark is recognized by the controller, processing is triggered to map the mark to the frame of reference of the printing system, by determining the actual position of the mark in the printing system frame of reference. As a result of mark recognition and mapping processing, with or without image recapturing, the recognized substrate mark 501, shown in solid lines in FIG. 5A, is found at an actual position 504B in the frame of reference of the printing system. The controller 118 can determine the actual position of the recognized substrate mark 501 based on the known actual positions of the capturing line scan imager 303. The actual position 504B has X-Y coordinates shifted from those of the expected position 504A. The orientation of the recognized substrate mark 501 may also be different from its expected orientation, as shown by angle $\alpha$ between the vertical element 502 of the recognized substrate mark 501 at the actual position 504B and the Y direction. In an example, the described image capturing and mark recognition processing are performed to acquire more than one substrate marks, such as substrate marks 501, 511, 521, 531 on the substrate 308. In a further example, the actual positions of one or more other substrate marks 511, 521, 531 are calculated based on the determined actual positions of the substrate mark 501, and the design data that includes known relationships among the substrate marks. The determined actual positions and/or orientations and/or other actual properties of the one or more substrate marks are used by the controller 118 to determine actual positions and/or orientation of the substrate 308, based on known relationships in the design data between the one or more substrate marks and the substrate 308. The determined actual positions and/or orientation of the substrate 308 may be used by the controller 118 to physically adjust the substrate 308 and/or to make correction to printing data of the design to be printed on the substrate 308.

At operation 425, expected positions of a plurality of second alignment features on the substrate are determined, based on the actual position of the first alignment feature. For example, the controller 118 uses the actual positions and/or orientations of one or more of the substrate marks 501, 511, 521, 531 determined at operation 415 to calculate expected positions of the print region marks, based on known relationships in the design data between the one or more substrate marks and the print region marks. An example technique for calculating the expected positions of the print region marks is bilinear interpolation including one or more interpolation operations such as translational, rotational, skew and scaling.

Figure 5B:
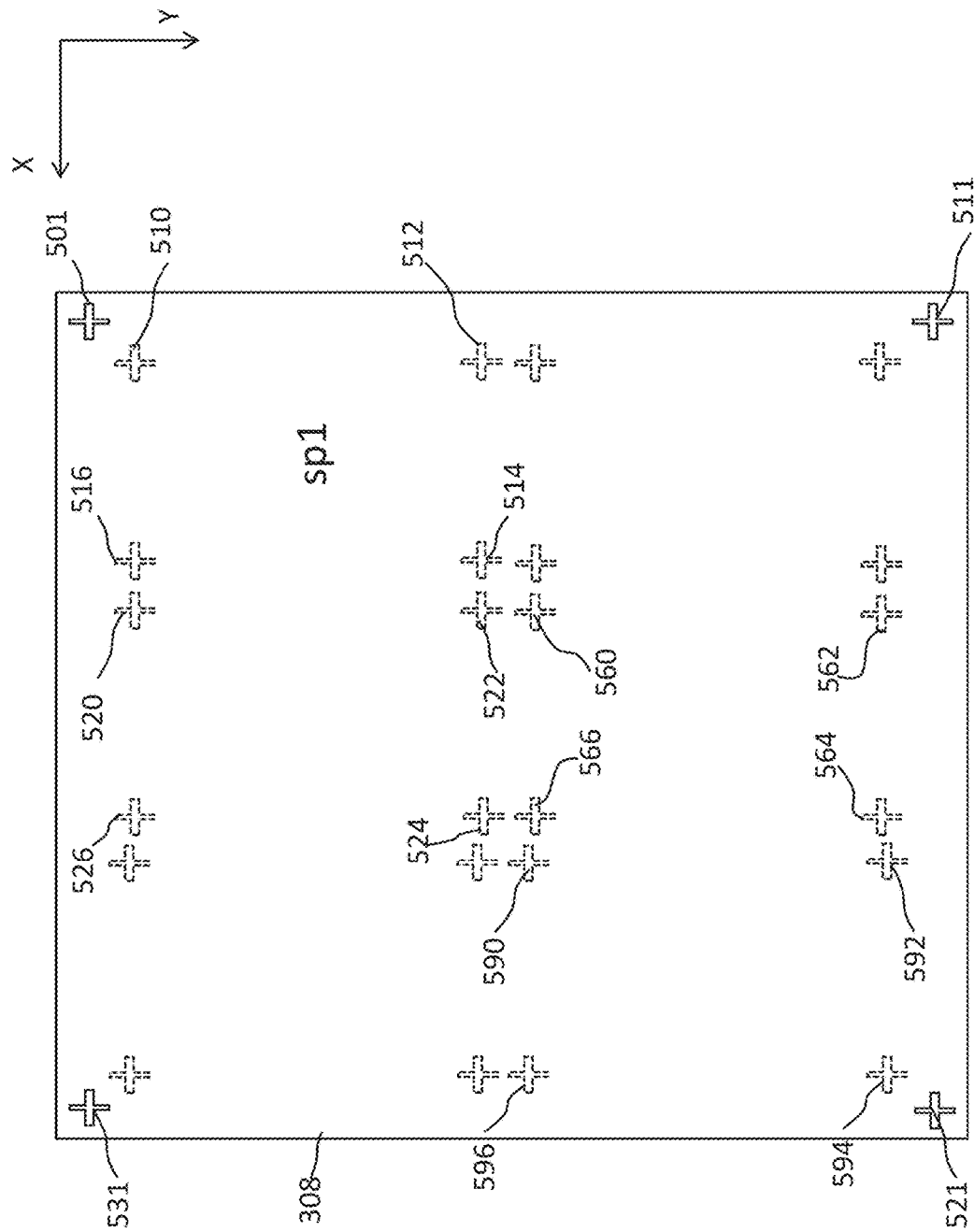

FIG. 5B is a schematic plan view showing the substrate 308 as ascertained by the controller 118 as a result of the operation 425. In FIG. 5B, the actual positions of the substrate marks 501, 511, 521, 531 are determined at operation 415, and are shown at their actual positions in solid lines. The print region marks are not yet recognized or mapped, and are shown at their respective expected positions in dotted lines. It should be noted that, in this example, the marks 510, 512, 514, 516 corresponding to the misplaced print region sp1 described with respect to FIG. 3B are still expected to be at positions close to ideal or expected positions defined in the design data.

At operation 435, actual positions of the second alignment features are determined based on the at least one image and the expected positions of the second alignment features. For example, the controller 118 performs a mark recognition processing in an area of the image captured at the operation 405 where the expected position determined at the operation 425 indicates that a print region mark may be located. This is possible in situations where the image captured at the operation 405, e.g., by the line scan imager 303, is a high-resolution image that covers a large area of the substrate 308 where one or more substrate marks and one or more print region marks are located. Thus, one or more print region marks are already included in the captured image, and may be processed from the same image without image recapturing. In situations where the captured images do not cover all print region marks, additional images are captured in a manner similar to the operation 405.

The actual positions of the recognized print region marks are determined from the captured image data in a manner similar to the operation 415. All print region marks indicating a print region may be recognized and their actual positions may be determined from the captured image(s). For example, all print region marks 520, 522, 524, 526 indicating the print region sp3 may be recognized and their actual positions may be determined from the captured image(s). This arrangement provides print region definition at high accuracy. However, in some situation, the actual position of at least one print region mark indicating a print region may be calculated from the actual positions of the other print region marks indicating the same print region. For example, some print region marks 510, 512, 514 indicating the print region sp1 are recognized and their actual positions are determined from the captured image(s); however, the actual position of the remaining print region mark 516 indicating the same print region sp1 is calculated from the determined actual positions of the other print region marks 510, 512, 514. This arrangement sacrifices some accuracy in print region definition for a faster processing speed. Such accuracy sacrifice may affect printing precision, and eventually the printed product quality, when the print region sp1 is significantly misplaced as described with respect to FIG. 3B.

Figure 5C:
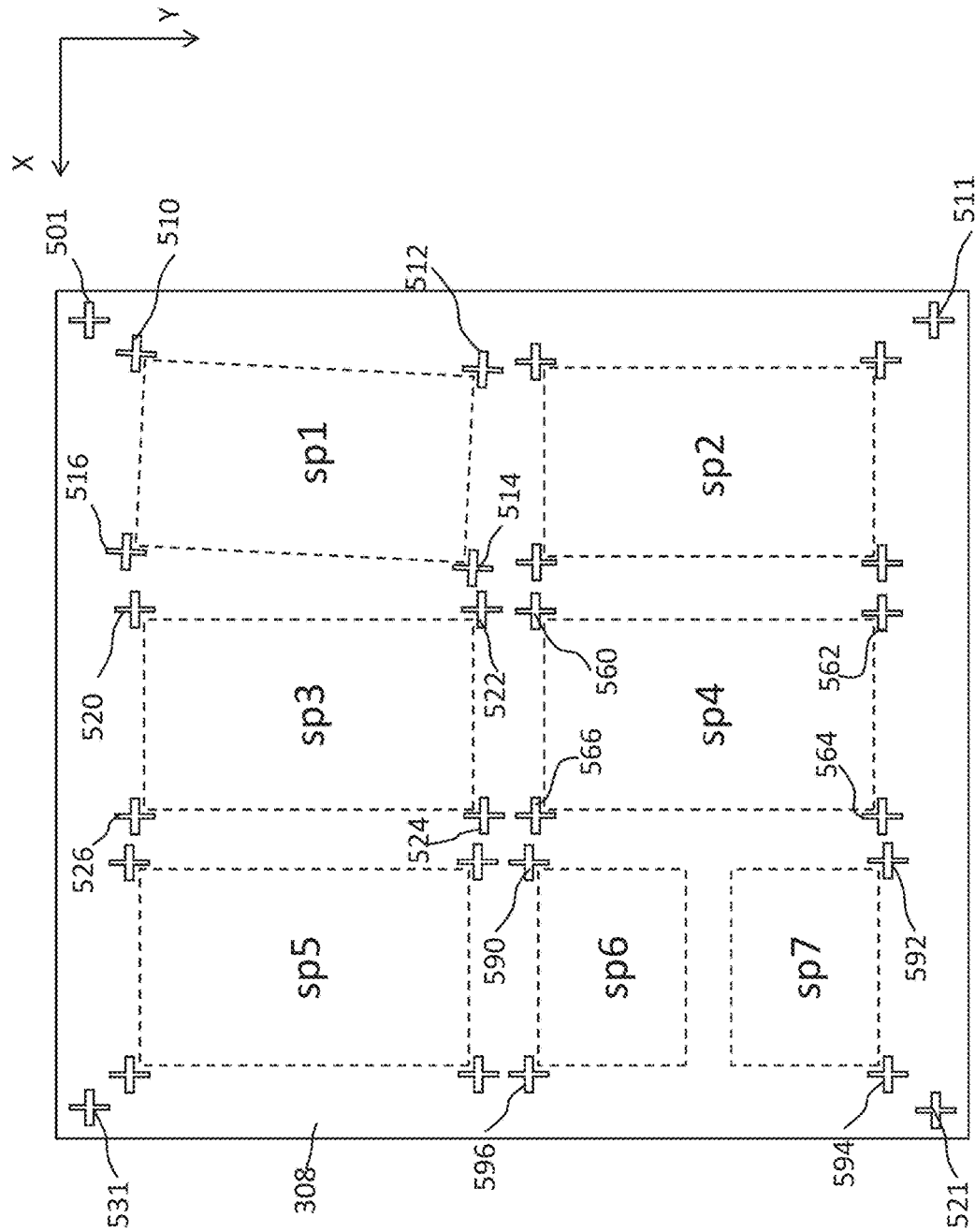

FIG. 5C is a schematic plan view showing the substrate 308 as ascertained by the controller 118 as a result of the operation 435. In FIG. 5C, all substrate marks and print region marks have been mapped into the printing system frame of reference from the operations 415 and 435, and are shown at their actual positions in solid lines. The print regions indicated by the print region marks are not yet acquired and are shown in dotted lines. That is, the coordinates of every print location within the respective print regions, in the frame of reference of the printing system, have not yet been determined. The controller 118 has now determined, and may have quantified and/or flagged, that the print region sp1 is not at its expected position (FIG. 5B) but is actually misplaced (FIG. 5C). This detected placement error of the print region sp1 permits the controller 118 to make corrections to improve printing accuracy, as described herein. In at least one embodiment, not all print region marks are processed at once. For example, the print region marks corresponding to the print region sp1 and print region sp2 are processed first so that printing can proceed in the print region sp1 and print region sp2. While a printing operation is being performed in the print region sp1 and print region sp2, the print region marks corresponding to the print regions to be printed next, i.e., the print region sp3 and print region sp4 are mapped, and so on. This arrangement reduces the processing and printing time for the whole substrate 308 by performing operations in parallel.

At operation 445, target positions of a plurality of print regions on the substrate are determined based on the actual positions of the second alignment features. As used herein, "target position" of a print region or pixel is the actual position of the print region or pixel in the frame of reference of the printing system, and is the location where a printhead assembly of the printing system is controlled to deposit print material. The design data may include a coordinate map representing expected positions of the marks and at least corners of the corresponding print regions, for example, as X-Y coordinates in the frame of reference of the printing system or the substrate. Taking the print region sp3 as an example, once the marks 520, 522, 524, 526, have been mapped by the controller 118, the actual positions of the marks 520, 522, 524, 526 are compared to their positions known/expected from the design data. From the comparison, the controller 118 derives a relationship for converting between the positions of the marks 520, 522, 524, 526, as determined from the captured image(s) and their known/expected positions from the design data. The derived relationship and the expected positions of corresponding corners 540, 542, 544, 546 of the print region sp3 in the design data are used by the controller 118 to determine actual positions of corners 540, 542, 544, 546 of the print region sp3 in the frame of reference of the printing system.

The controller 118 then determines actual positions of all pixels to be printed in the print region sp3 from the actual positions of the corners 540, 542, 544, 546. An example technique for determining the actual positions of the pixels from the corners is bilinear interpolation including one or more interpolation operations such as translational, rotational, skew and scaling. Alternatively, in a thin film encapsulation (TFE) application where a thin film is to be deposited over the print region sp3 instead of individual pixel printing, the controller 118 determines actual positions of the boundary of the print region sp3 from the actual positions of the corners 540, 542, 544, 546. The determination of actual positions of marks, print region corners, pixels or boundaries in the frame of reference of the printing system is also referred to herein as mapping. In some embodiments, nozzle mapping is performed by the controller 118 in a similar manner to determine actual positions of the dispensing nozzles of the printhead assembly 119, based on nozzle surface marks (not shown) included in the nozzle surface 329 and one or more images including such nozzle surface marks captured by the imaging device 302.

Figure 5D:
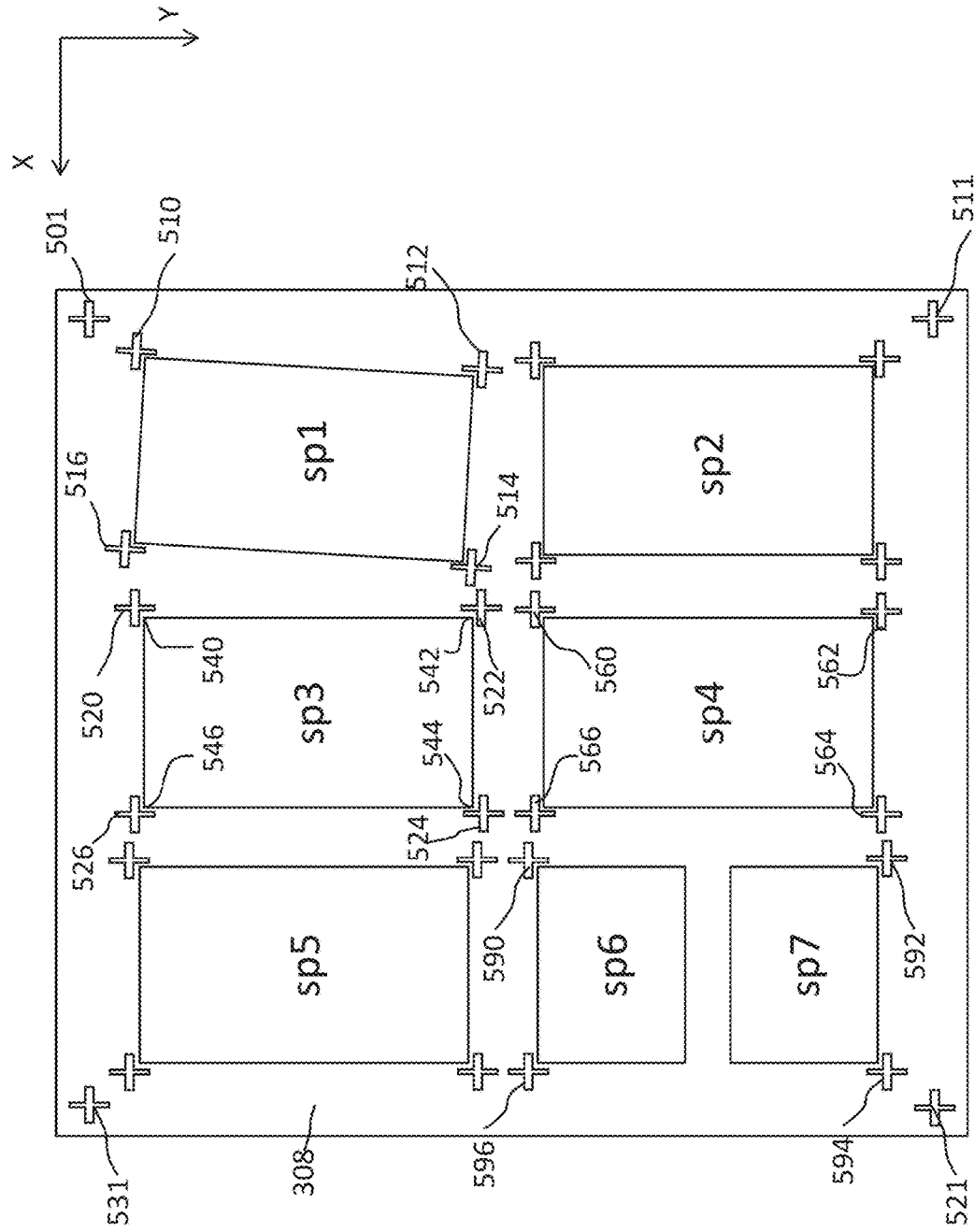

FIG. 5D is a schematic plan view showing the substrate 308 as ascertained by the controller 118 as a result of the operation 445. In FIG. 5D, all substrate marks, print region marks and print regions are already mapped from the operations 415, 435, 445 and are shown at their actual positions or target positions in solid lines. This is an example only. As noted above, one or more print regions may be processed while a printing operation is being performed in one or more other print regions.

Although in the above description, print region recognition and mapping involves capturing and processing marks for each print region individually, the present disclosure is not so limited. For example, print region definition may involve capturing and processing a set of marks 590, 592, 594, 596 common for several print regions, for example, as shown in FIG. 5D for the print region sp6 and print region sp7. When all common marks 590, 592, 594, 596 have been captured and recognized, actual positions of the pixels or boundaries of the print region sp6 and print region sp7 are determined, e.g., by interpolation, from the actual positions of the common marks 590, 592, 594, 596, and also based on the design data which specifies expected positions or relationships of the print region sp6 and print region sp7 with respect to the marks 590, 592, 594, 596.

At operation 455, ejection of print material onto the substrate in the plurality of print regions is controlled based on the determined target positions of the print regions. For example, based on the actual positions of the pixels or boundaries of the print region sp3 and/or the actual positions of the dispensing nozzles of the printhead assembly 119 in the frame of reference of the printing system, the controller 118 controls ejection of print material from the dispensing nozzles of the printhead assembly 119 to the print region sp3 of the substrate 308. In one embodiment, this print material ejection control includes physical adjustments of the substrate 308 and/or the printhead assembly 119, and/or logical modification of print data to be used for generation of control signals for the dispensing nozzles to eject print material. Because the determined actual positions of the dispensing nozzles and/or the print region sp3 reflect the real physical positions of the dispensing nozzles and the print region sp3 with high accuracy, printing accuracy is improved.

Specifically, the actual positions of the dispensing nozzles and the print regions are in the same frame of reference of the printing system, and are used by the controller 118 to control, when and/or which dispensing nozzles to eject print material in accordance with the design data which include(s) printing data or coordinates in the frame of reference of the substrate. For example, if a print nozzle is found at a location different from its expected location by a distance d, a droplet ejected according to an existing print plan will arrive at a location different from its target location t by the distance d. If the distance d has an x-component (distance in the X direction) $d_x$, the printhead assembly can be adjusted by $-d_x$ to compensate. If the print nozzles deviate in the X direction from their expected locations by an average distance $\bar{d}_x$ the print assembly can be adjusted by $-\bar{d}_x$ to compensate. If the distance d has a y-component $d_y$, the print plan can be adjusted with a global firing delay of $d_y/v$, where v is the translation velocity of the substrate in the Y direction, and likewise for a y-component of the average distance $\bar{d}_y$. As a result, printed products with high printing precision are obtainable.

In one embodiment, printed products manufactured by the described printing method include, but are not limited to, solar panels, and flat panel displays such as organic light emitting diode (OLED) displays.

Figure 6A:
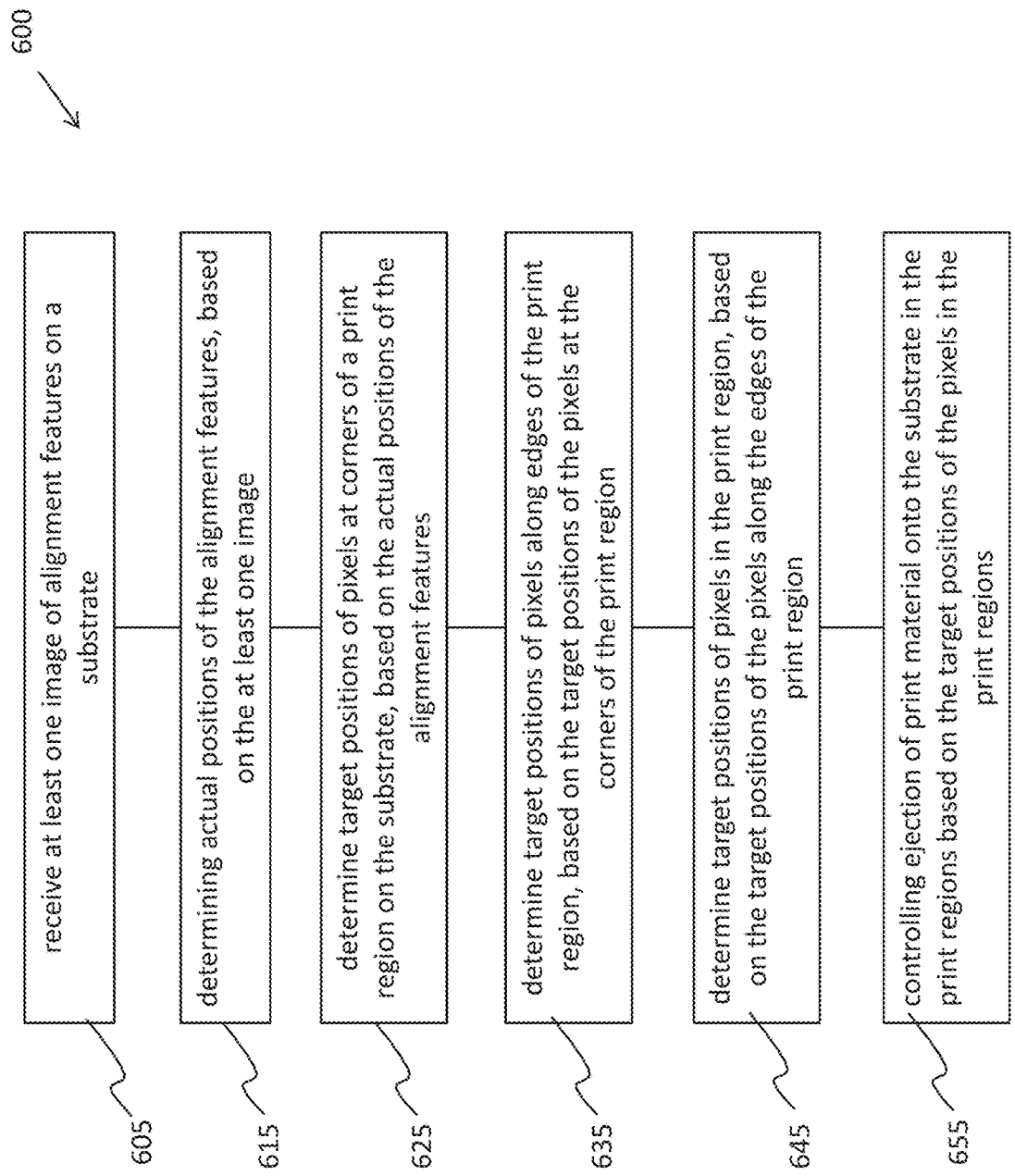
FIG. 6A is a flowchart of a printing method in accordance with one embodiment.
Figure 6B:
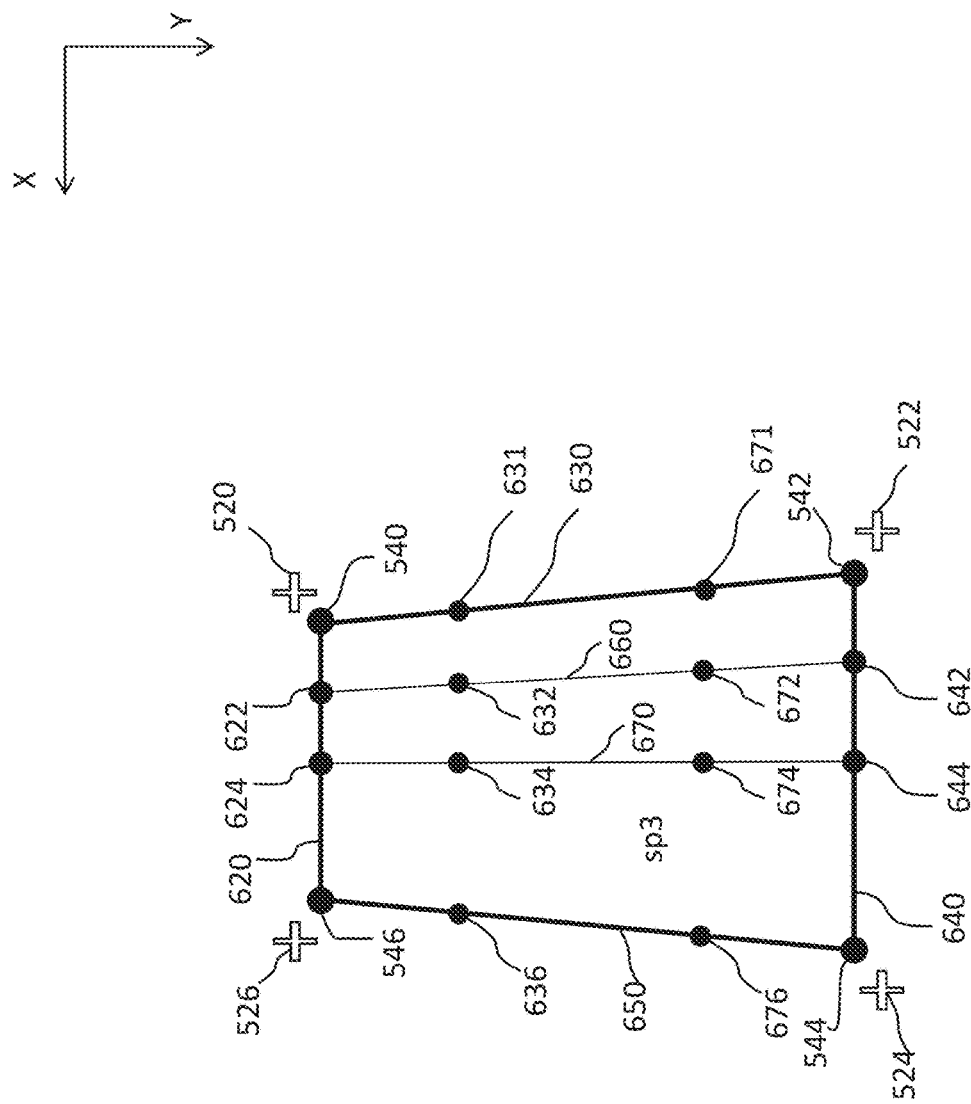
FIG. 6B is a schematic plan view of a print region on a substrate being processed in the printing method in FIG. 6A.

FIG. 6A is a flowchart of a printing method 600 in accordance with one embodiment. FIG. 6B is a schematic plan view of the print region sp3 on the substrate 308 being processed in the printing method 600 in FIG. 6A. The pixel sizes in FIG. 6B are exaggerated for illustrative purposes. The printing method 600 may be performed in any of the printing systems 100, 200 and 300 by, or under control of, at least one controller as described herein. In the description below, the printing method 600 is performed by, or under control of, the controller 118. In one embodiment, the printing method 600 includes one or more features of the printing method 400 described herein.

At operation 605, at least one image including alignment features on a substrate is acquired. For example, the controller 118 acquires at least one image including one or more marks from the first imaging device 201 and/or second imaging device 202 of the printing system 200, or the line scan imager 303 of the printing system 300, in a manner similar to operation 405 of the printing method 400.

At operation 615, actual positions of the plurality of alignment features in a frame of reference of the printing system are determined based on the at least one image. For example, the controller 118 determines, from the captured image, the actual positions of the marks 520, 522, 524, 526 indicating the print region sp3, in a manner similar to the operation 415 and/or the operation 435 of the printing method 400.

At operation 625, target positions of pixels at corners of a print region on the substrate are determined based on the actual positions of the alignment features. For example, the controller 118 compares the actual positions of the marks 520, 522, 524, 526 to their preset positions in the design data to derive a relationship or transform function for converting between the actual positions of the marks 520, 522, 524, 526, e.g., as determined from the captured image(s), and their preset positions from the design data. The derived transform function and preset positions of the corners 540, 542, 544, 546 in the design data are used by the controller 118 to determine actual positions of the corners 540, 542, 544, 546.

At operation 635, target positions of pixels along edges of the print region are determined based on the target positions of the pixels at the corners of the print region. For example as shown in FIG. 6B, the controller 118 uses the actual positions of the corners 540, 546 to determine a first edge 620 of the print region sp3, the actual positions of the corners 540, 542 to determine a second edge 630, the actual positions of the corners 542, 544 to determine a third edge 640, and the actual positions of the corners 544, 546 to determine a fourth edge 650 of the print region sp3.

For a TFE application, the controller 118 may now proceed to operation 655 to control the printhead assembly to deposit a thin film over the print region sp3 within a boundary defined by the determined edges 620, 630, 640, 650 of the print region sp3.

For printing at individual pixels in the print region sp3, the controller 118 determines actual positions of pixels 622, 624 along the determined first edge 620 based on a number of pixels per row of the print region sp3 in the X direction from the design data, e.g., by distributing the pixels evenly along the first edge 620. Similarly, the controller 118 determines actual positions of pixels 642, 644 along the determined third edge 640 based on the same number of pixels per row.

At operation 645, target positions of pixels in the print region are determined based on the target positions of the pixels along the edges of the print region. For example as shown in FIG. 6B, the controller 118 determines actual positions of pixels 631, 671 along the determined second edge 630 based on a number of pixels per column of the print region sp3 in the Y direction from the design data. Similarly, the controller 118 determines actual positions of pixels 636, 676 along the determined fourth edge 650 based on the same number of pixels per column. For pixels inside the print region sp3, the controller 118 first determines a column 660 of pixels based on corresponding determined pixels 622, 642 on the corresponding first and third edges 620, 640. The controller 118 then determines actual positions of pixels 632, 672 along the determined column 660 based on the number of pixels per column. Similarly, the controller 118 determines a column 670 of pixels based on corresponding determined pixels 624, 644 on the corresponding first and third edges 620, 640, and then determines actual positions of pixels 634, 674 along the determined column 670 based on the number of pixels per column. The described processing is repeated until the actual positions of all pixels in the print region sp3 have been determined.

In at least one embodiment, the operations 625, 635, 645 of the printing method 600 are performed in the operation 445 of the printing method 400 for determining target positions of print regions on a substrate based on actual positions of print region marks.

At operation 655, ejection of print material from dispensing nozzles of a printhead assembly onto the print region of the substrate is controlled based on the target positions of the pixels in the print region. For example, the controller 118 controls ejection of print material in a manner similar to operation 455 of the printing method 400.

Figure 7:
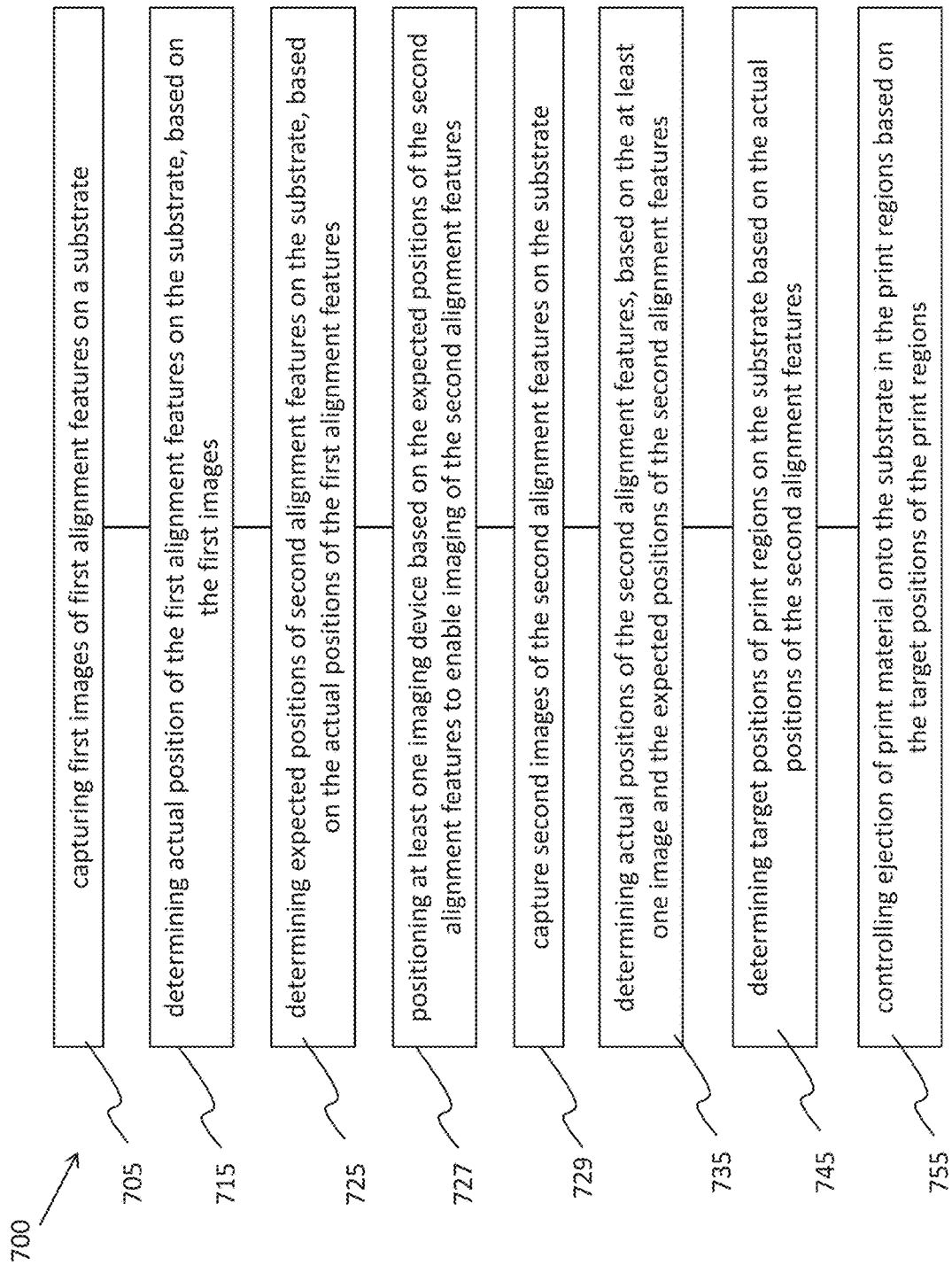
FIG. 7 is a flowchart of a printing method in accordance with one embodiment.

FIG. 7 is a flowchart of a printing method 700 in accordance with one embodiment. The printing method 700 may be performed in any of the printing systems 100, 200 and 300 by, or under control of, at least one controller as described herein. In the description below, the printing method 700 is performed by, or under control of, the controller 118. In one embodiment, the printing method 700 includes one or more features of the printing methods 400, 600 described herein.

At operation 705, at least one imaging device is controlled to capture first images of a plurality of first alignment features on a substrate. For example, the controller 118 controls the first imaging device 201 and/or second imaging device 202 to capture one or more first images including substrate marks 501, 511, 521, 531 on the substrate 308, in a manner similar to operation 405 of the printing method 400.

At operation 715, actual positions of the first alignment features in the frame of reference of the printing system are determined based on the first images. For example, the controller 118 performs a mark recognition process on the captured first images to recognize the substrate marks 501, 511, 521, 531 from the captured first images, and then determines actual positions of the recognized substrate marks, in a manner similar to operation 415 of the printing method 400. In some situations, multiple image capturing by multiple imaging devices are performed, as described with respect to FIG. 2.

At operation 725, expected positions of a plurality of second alignment features are determined based on the actual positions of the plurality of first alignment features. For example, the controller 118 determines expected positions of the print region marks based on the actual positions of the substrate marks, in a manner similar to operation 425 of the printing method 400.

At operation 727, a relative position of the at least one imaging device and a substrate support supporting the substrate is controlled based on the expected positions of the second alignment features to enable imaging of the second alignment features using the at least one imaging device. For example, the controller 118 performs control to re-position the first imaging device 201 and/or second imaging device 202 so that one or more expected positions determined at operation 725 for one or more print region marks may fall within the field of view of the first imaging device 201 and/or second imaging device 202.

At operation 729, the at least one imaging device is controlled to capture second images of the second alignment features. For example, after the re-positioning at operation 727, the controller 118 controls the first imaging device 201 and/or second imaging device 202 to capture one or more second images including the expected positions of one or more print region marks.

At operation 735, actual positions of the second alignment features in the frame of reference of the printing system are determined based on the second images. For example, the controller 118 performs a mark recognition processing on the second images captured at the operation 729 to recognize one or more print region marks from the captured second images, and to determine actual positions of the recognized print region marks, in a manner similar to operation 715. In some situations, multiple image capturing by multiple imaging devices are performed, as described with respect to FIG. 2.

In situations where the fields of view of the first imaging device 201 and/or second imaging device 202 are not sufficiently wide to capture one or more print region marks and/or substrate marks in a first image, the at least one imaging device can be repositioned, as in operation 727, and subsequent images captured, as in operation 729. Where an image captured by a line scan imager, such as the line scan imager 303 of FIG. 4, may cover a sufficiently wide area of the substrate 308 to capture target marks, a separate image capturing process can be avoided.

At operation 745, target positions of print regions corresponding to groups of the second alignment features are determined based on the actual positions of the second alignment features. For example, the controller 118 determines target positions of a print region based on the actual positions of the corresponding set of print region marks, in a manner similar to operation 445 and/or operations 625, 635, 645.

At operation 755, ejection of print material from dispensing nozzles of a printhead assembly onto the substrate in the print regions is controlled based on the target positions of the print regions. For example, the controller 118 controls print material ejection in a manner similar to operation 455.

In some cases, the line scan imager can be used to correct the position of a substrate on the substrate support 102 (FIG. 1). Thus, instead of, or in addition to, performing operation 755 above, a repositioning operation can be performed to improve the positioning of the substrate on the substrate support. In one example, the actual positions of the substrate marks can be compared to expected positions of the substrate marks based on design data for the substrate and a deviation parameter can be determined by any of the controllers or processors described herein. The deviation parameter may be determined in a number of ways. In one example, a deviation of each substrate mark from its design position can be determined, and the deviation parameter can be set to the maximum of the deviations. In another example, the deviation parameter can be set to the average of the deviations. In another example, the deviation parameter can be set to the deviation of a predetermined substrate mark.

The deviation parameter is then compared to a tolerance to determine whether the substrate needs to be repositioned.

Any of the controllers or processors described herein can perform the comparison. If the substrate needs to be repositioned, the printing system is controlled to perform the standard substrate positioning routine over again. This process can be repeated until the deviation parameter is within tolerance, at which time operation 755 above can be performed.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

Figure 8:
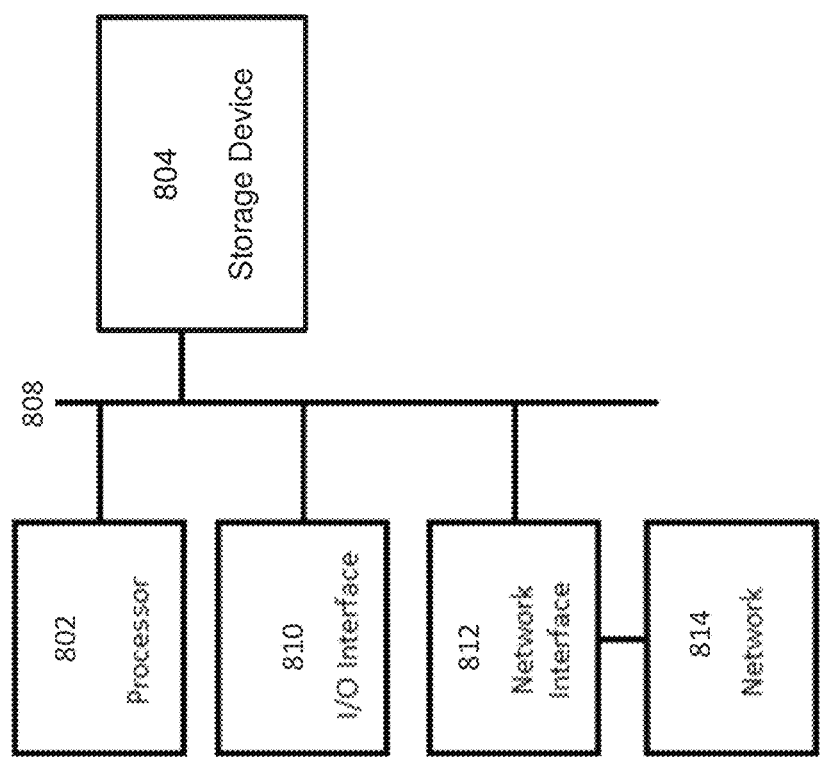
FIG. 8 is a block diagram of a controller, in accordance with one embodiment.

FIG. 8 is a block diagram of a controller, in accordance with one embodiment. One or more of the units and/or systems and/or operations described with respect to FIGS. 1-7 is/are realized in one embodiment by one or more controllers 800 of FIG. 8.

The controller 800 comprises a hardware processor 802, a storage device 804 including at least one non-transitory, computer readable storage medium, a bus 808, an I/O (input/output) interface 810, and a network interface 812. The processor 802 is coupled with the storage device 804, the I/O interface 810, and the network interface 812 via the bus 808. The network interface 812 is connectable to a network 814, so that the processor 802 and the storage device 804 are communicable with other devices via the network 814. The processor 802 is configured to execute computer program instructions encoded in the storage device 804 and/or to access data stored in the storage device 804 to cause the controller 800 to perform one or more functionalities and/or operations described with respect to FIGS. 1-7.

The processor 802 includes one or more of a central processing unit (CPU), a multi-processor, a distributed processing system, an application specific integrated circuit (ASIC), and/or a suitable hardware processing unit.

The storage device 804 includes one or more of an electronic, magnetic, optical, electromagnetic, infrared, and/or a semiconductor system (or apparatus or device) for storing instructions and/or data in a non-transitory manner. For example, the storage device 804 includes a semiconductor or solid-state memory, a magnetic tape, a removable computer diskette, a random access memory (RAM), a read-only memory (ROM), a rigid magnetic disk, and/or an optical disk. As examples of optical disks, storage device 804 includes a compact disk-read only memory (CD-ROM), a compact disk-read/write (CD-R/W), and/or a digital video disc (DVD).

The I/O interface 810 is circuitry that is connectable with external circuitry. For example, the I/O interface 810 includes one or more of a keyboard, keypad, mouse, trackball, trackpad, cursor direction keys, card reader, communication port, display, signal light, printer and/or audio device for communicating information to/from the processor 802. In an example, the I/O interface 810 is omitted.

The network interface 812 is circuitry that allows the controller 800 to communicate with the network 814, to which one or more other controllers and/or image capturing/processing equipment are connected. For example, the network interface 812 includes one or more of wireless network interfaces such as BLUETOOTH, WIFI, WIMAX, GPRS, or WCDMA; or wired network interface such as ETHERNET, USB, or IEEE-1394. In an example, the network interface 812 is omitted.

By being configured to execute some or all of functionalities and/or operations described with respect to FIGS. 1-7, the controller 800 enables the realization of one or more advantages and/or effects described with respect to FIGS. 1-7.

Alignment features on a substrate can be located quickly if the substrate has a layout that is generally known in advance such that the printing system can be configured to take advantage of the substrate layout. If a series of substrates having similar, or the same, layout are to be processed, a printing system can be configured with cameras located and actuated to focus on the likely positions of alignment features to locate the alignment features quickly on successive substrates.

In one case, a substrate has six panels defined across the width of the substrate. The panels can define single display devices to be formed on the substrate or groupings of display devices to be formed on the substrate. Configuring a printing system with cameras to acquire and locate alignment marks quickly for such substrates is summarized in the supplemental figures attached to this application in an Appendix. Here, the substrate has one or more first alignment features, sometimes called fiducial marks, and each panel on the substrate is defined using one or more second alignment features. Because it is generally known in advance that the substrate has six panels of substantially equal size and shape uniformly spaced across the width of the substrate, cameras or line imagers can be positioned along a print support, as described herein, and actuated to locate the first and second alignment features.

In this case, a first camera system comprising one or more cameras captures a wide image of one or more areas of the substrate. The substrate is scanned from an input side of the printing system to an output side of the printing system for a first scan, and the first camera system captures a first image, or a plurality of first images, of the substrate during the first scan. The first scan captures images of at least two of the first alignment features, and may also capture one or more of the second alignment features. The first scan may capture an image of the entire substrate, or the first scan may only capture those areas of the substrate where first alignment features are expected to be found. Thus, a single first image may include more than one first alignment feature captured in multiple images and logically combined, or the first scan may capture a plurality of first images.

The substrate is typically positioned at the input end of the printing system for processing. The substrate is placed against positioning features, such as physical posts or banks, which initialize the position of the substrate. The substrate positioning system acquires a secure attachment to the substrate for further positioning. The substrate typically has opposite first and second ends and opposite first and second sides. The first end of the substrate passes under the various imaging systems followed by the second end. As noted above, the first image or plurality first images includes at least two of the first alignment features, and may include more than two. If the two first alignment features are located at the first end of the substrate, then the first scan may be just a partial scan of the substrate, just to image the first alignment features expected to be found near the first end.

In one case, the first alignment features may be expected to reside near the corners of the substrate, so wide area cameras can be located on both sides of the substrate processing surface of the printing system to capture wide area images of the substrate near those expected locations. Each wide area camera has a field of view large enough to moot conceivable error in locating the first alignment features so the wide area cameras are virtually certain to capture the first image (or images). In one embodiment, error in positioning the first alignment features is about 2 mm, and wide area cameras having a viewing field of 10-13 mm are used.

The first image or images is/are analyzed using image processing software to identify alignment features therein. The image processing software searches for first alignment features by a localized search informed by an expected location of the first alignment features. The expected location is defined as coordinates in a first coordinate system defined for the printing system, as described elsewhere herein, and is based on a pre-defined layout of the substrate that includes coordinates of alignment features in a second coordinate system defined for the substrate. A mathematical transformation relating the second coordinate system to the first coordinate system is based at least in part on a home location of the substrate when the substrate is loaded into the input side of the printing system. Thus, the expected locations of all alignment features, including the first and second alignment features, is known by transforming the coordinates of the alignment features from the pre-defined layout to the first coordinate system using the mathematical transformation.

The image processing software determines, at least, an alignment of the first alignment features, by determining an x coordinate and a y coordinate of each first alignment feature. As described herein, the y direction is the scan direction of the substrate and the x direction is the direction within the plane of the substrate perpendicular to the y direction. If the first alignment features should have the same x coordinate value, the extent to which the x coordinates of the first alignment features are not the same indicates a rotational error of the substrate. As noted elsewhere herein, the substrate positioning system is operable to rotate the substrate incrementally to align the x coordinates of the first alignment features based on the alignment error determined from processing the image or images of the substrate. A rotation angle can be defined in radians as the x coordinate difference of the first alignment features divided by the y coordinate difference of the first alignment features. To the extent the aligned x coordinates of the first alignment features deviate from an expected location of the substrate based on a pre-defined substrate processing plan, the positioning system can also position the substrate to correct global x-error of the substrate. Alternately, for purposes of capturing images of alignment features, camera positions can be adjusted for the global x-error of the substrate.

The positioning system may also be configured to position the substrate, or a portion thereof, in the z direction, which is the direction substantially perpendicular to the substrate processing surface of the printing system (and to the x and y directions). The positioning system may have a precision z actuation component, for example a z-axis linear actuator coupled to the substrate engagement portion of the positioning system, to perform z positioning of the portion of the substrate engaged by the positioning system. In many cases, the substrate is engaged with the positioning system at an edge of the substrate, so the z actuation component positions the edge of the substrate in the z direction. This can have the effect of positioning the entire substrate at least somewhat in the z direction and/or positioning the edge of the substrate in the z direction. In many cases, the substrate is floating on a gas cushion that precisely defines a gap between the substrate and the substrate processing surface independent from movement by the positioning system. Working together, the gas cushion and the positioning system can precisely position the substrate a distance above the substrate processing surface that is pre-defined in the substrate processing plan, and can render the substrate flat to a high degree of precision across the extent of the substrate, including the edge portion where the positioning system engages with the substrate.

The image processing and alignment actions described above may be performed while the substrate is positioned at the output side of the printing system following the first scan. In the event the substrate is not scanned entirely to the output side of the printing system during the first scan, the substrate may wait in a partially scanned position while image processing and alignment are performed, or the substrate may be moved back to the input side of the printing system for alignment. Having aligned the substrate and positioned the substrate according to the substrate processing plan, a second scan is performed wherein the positioning system moves the substrate from the output side to the input side of the printing system, or vice versa. During the second scan, a second camera system comprising one or more cameras captures a plurality of second images of the substrate. Each camera of the second camera system is positioned based on an expected location of one or more second alignment features, the expected location based on the pre-defined substrate layout corrected according to the alignment performed following the first scan.

The second camera system has high magnification cameras to capture high resolution images of the second alignment features. In one instance, the high magnification cameras have a view field that is about 1 mm in size, so each high magnification camera can capture one alignment feature in size less than about 1 mm, and may be able to capture more than one alignment feature in one scan if the alignment features are close than 1 mm separation distance. Typically, as the substrate is scanned, the cameras of the second camera system will activate when an alignment feature to be imaged is expected to arrive within the view field of one of the cameras of the second camera system, and will deactivate when the alignment feature is expected to pass out of the view field. The expected time of arrival of alignment features within the field of view of a camera is determined using the pre-defined layout of the substrate, corrected for any positioning of the substrate done during calibration.

The second scan may result in images being captured of all second alignment features. In some cases, however, one scan may not result in images being captured of all the second alignment features. For example, if some second alignment features are too close to be imaged by one camera at the scan speed of the second scan, due to camera cycle time, one or more alignment features may be missed during the second scan, and a third scan may be needed to capture those that were missed. In such cases, an alternative is to slow down the scan speed so that all features can be imaged in one scan. Another alternative is to use more than one camera to image alignment features in one column.

Each second image is processed by the image processing software to determine actual locations of at least two second alignment features for each panel defined on the substrate. Because the substrate layout is generally known in advance, a camera of the second camera system is deployed to capture an image for each panel defined on the substrate. Each camera of the second camera system thus captures an image of at least two alignment features for each panel defined on the substrate. The cameras of the second camera system are high magnification cameras with limited field of view, but because the substrate is aligned, and the expected locations of the second alignment features from the pre-defined layout are used to position the cameras of the second camera system, each second image contains a high resolution image of at least one second alignment feature. The precisely determined actual locations of the second alignment features are used to adjust the print plan for any error in positioning the panels on the substrate.

In the case where six panels are defined across the width of the substrate, six high magnification cameras can be included in the second camera system and positioned at locations where second alignment features are expected to be found on the substrate. Each camera of the second camera system captures one or more images of the substrate as the substrate is scanned during the second scan. Multiple images can be logically joined by image processing software, if desired, or the images may be taken only in the vicinity of expected locations of alignment features such that there are gaps between the locations of the images. In any event, the six high magnification cameras capture images of at least two second alignment features of each panel defined on the substrate. Capturing images of more than two second alignment features of each panel can increase certainty of panel positioning and system calibration.

It should be noted that a single camera configuration of a printing system may be used to align and calibrate the printing system for substrates having different layouts and sizes. In general, if the printing system has n high magnification cameras, a substrate with m panels can be aligned and calibrated to the printing system if m is less than n. Because the range of travel of the high magnification cameras is known and positioning of the cameras can be based on the known range of travel, a camera can be positioned at the expected x location of alignment features if there are as many cameras as panels. The same is true for substrates having sections with different panel layouts. For example, a substrate may have a first section with three panels defined in the first section, and a second section with six panels defined in the second section. A portion of the six high magnification cameras in the second camera system, in this case three cameras, can be used to image the second alignment features for the three panels of the first section, and all the cameras can be used to image the second alignment features for the panels of the second section. If the second section has fewer panels than the total number of cameras in the second camera system, a second portion of the cameras of the second camera system can be used to image second alignment features for the panels of the second section.

The first camera system and the second camera system are each coupled to the print support substantially as described elsewhere herein. Each camera has a carriage that couples to a rail of the print support. Two rails can be defined on the print support, one for each camera system. Alternately, both camera systems may be supported on only one rail. In the two-rail case, the cameras of the first camera system can be coupled to, and actuated along, the first rail while the cameras of the second camera system are coupled to, and actuated along, the second rail. Thus, each camera of the first camera system has a range of motion limited by neighboring cameras, but since the cameras of the first camera system are wide view cameras, the first image can be captured by positioning the cameras of the first camera system at locations where first alignment features are expected to be found. Likewise for the cameras of the second camera system. The cameras of the second camera system can also be repositioned during the second scan if sections of the substrate have different panel layouts that require camera repositioning during the second scan. In some cases, the cameras of the second camera system may be moved slightly during scanning to capture images of second alignment features with close-by x coordinates.

Figure 9:
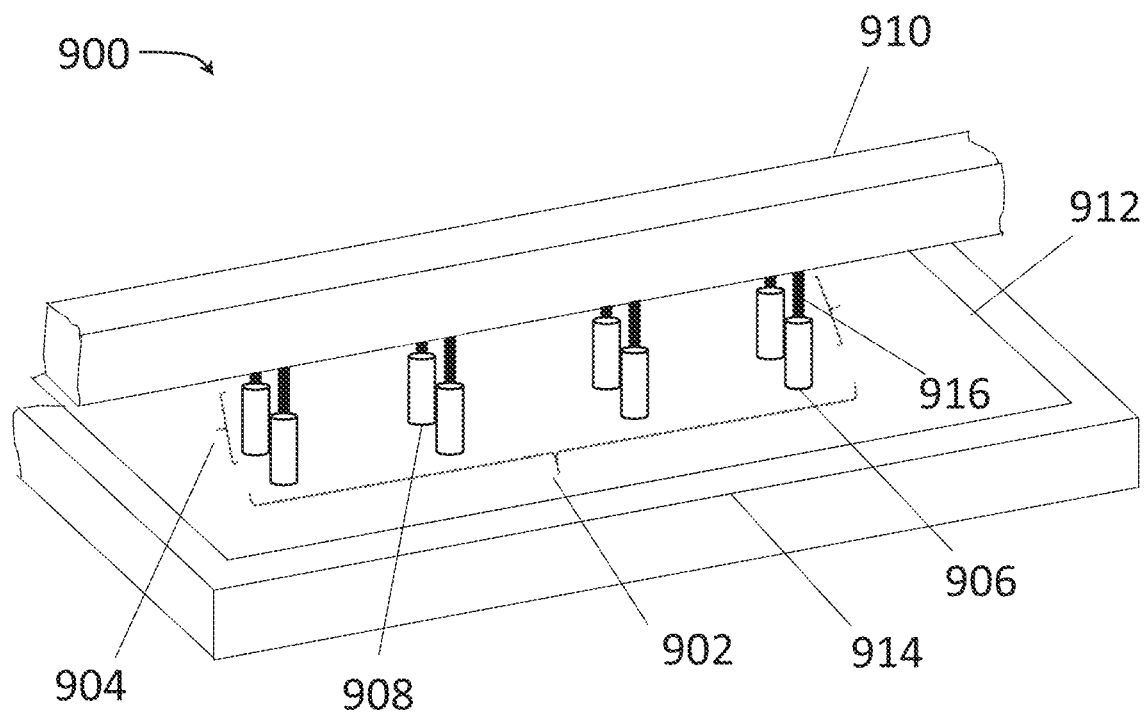
FIG. 9 is a schematic isometric view of a print assembly according to one embodiment.

FIG. 9 is a schematic isometric view of a print assembly 900 according to one embodiment. The print assembly 900 features a plurality of cameras deployed in a first camera system 902 and a second camera system 904. The print assembly 900 can be used to practice the embodiments described above that use a first camera system and a second camera system. The first camera system 902 comprises a plurality of first cameras 906, and the second camera system 904 comprises a plurality of second cameras 908. The first and second cameras 906 and 908 may be the same kind of camera, or may be different kinds of cameras. In one embodiment, the first cameras 906 are wide view cameras and the second cameras 908 are high-resolution cameras.

The print assembly 900 has a print support 910, which is like the rail 117 of FIG. 1. The print support 910 supports the first and second cameras 906 and 908 to traverse over and across a substrate 912 disposed on a substrate support 914 under the print support 910. Not shown here, the dispenser assembly 114 can be coupled to the print support 910, as in FIG. 1. Note that the print support 910, substrate 912, and substrate support 914 are shown truncated for size.

The first and second cameras 906 and 908 are coupled to, and supported by, the print support 910 in a spaced-apart relationship to the substrate support 914 to provide clearance between devices supported by the print support 910 and the substrate 912. The cameras 906 and 908 are each coupled to a camera support 916. The camera supports 916 coupled to the first cameras 906 are all coupled to a first track of the print support 910, which is not visible here but may be a groove in an underside surface of the print support 910 that faces the substrate support 914. The camera support 916 coupled to the second cameras 906 are coupled to a second track of the print support 910 in a similar way. The camera support 916 are configured to move past each other on the two tracks without colliding, thus enabling the first and second cameras 906 and 908 to be positioned along the print support 910 without interference between any of the first cameras 906 and any of the second cameras 908. This enables the first cameras 906 to be moved and positioned at any desired locations with respect to the substrate 912 while also positioning the second cameras 908 at any desired location independent of the first cameras 906. Each camera support 916 typically has actuators, for example driven wheels or air bearings, that engage with a groove or shelf formed on or in the lower surface of the print support 910 to provide positioning capability. The cameras 906 and 908 are coupled to the camera supports 916 in an orientation to allow the field of view for each camera 906 and 908 to encompass a portion of the substrate 912. It should be noted that some of the cameras 906 and 908 may be fixed to the print support 910 and unmovable with respect to the print support 910, but at least some of the cameras 906 and 908 are movable with respect to the print support 910. For example, the outer cameras of each camera group can be fixed, while cameras between the outer cameras may be actuated.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed:

1. A printing method, comprising:
disposing a substrate on a gas cushion substrate support of an inkjet printer;
obtaining an actual position of a first alignment feature of the substrate, in a frame of reference of the inkjet printer, based on a wide-area image of the first alignment feature;
positioning an imaging device based on comparing the actual position of the first alignment feature with an expected position of a second alignment feature of the substrate;
acquiring a high resolution image of at least a portion of the second alignment feature using the imaging device;
determining an actual position of the second alignment feature in the frame of reference of the inkjet printer based on the high resolution image;
determining a target position of a print region of the substrate based on the actual position of the second alignment feature; and
controlling the inkjet printer to eject print material onto the substrate in the print region based on the target position of the print region.

2. The printing method of claim 1, wherein
the wide-angle image is acquired during a first scan of the substrate on the substrate support in a first direction and the high resolution image is acquired during a second scan of the substrate on the substrate support in a second direction opposite to the first direction.

3. The printing method of claim 1, wherein
obtaining the actual position of the first alignment feature is based on using a controller equipped with image analysis software to recognize the first alignment feature in the wide-area image.

4. The printing method of claim 3, wherein the expected position of the second alignment feature is based on a comparison of the actual position of the first alignment feature to an expected position of the first alignment feature.

5. The printing method of claim 1, further comprising aligning the substrate in two orthogonal directions between acquiring the first image and acquiring the second image.

6. The printing method of claim 1, wherein the inkjet printer comprises a printhead assembly, and the imaging device is coupled to the printhead assembly.

7. The printing method of claim 6, wherein the controlling the inkjet printer to eject print material comprises moving the printhead assembly along the print support while ejecting the print material from dispensing nozzles of the printhead assembly.

8. The printing method of claim 7, wherein positioning the imaging device comprises positioning the printhead assembly to bring the expected position of the second alignment feature within a field of view of the imaging device.

9. The printing method of claim 1, wherein the wide-area image is captured using the imaging device set to a low resolution setting.

10. The printing method of claim 1, wherein the imaging device is a line scan imager.

11. The printing method of claim 10, wherein the wide-area image is obtained using the line scan imager.

12. The printing method of claim 1, wherein the inkjet printer comprises a printhead assembly having nozzles for dispensing material onto a substrate, and further comprising determining a actual position of at least one nozzle of the printhead assembly.

13. A printing method, comprising:
disposing a substrate on a gas cushion substrate support of an inkjet printer;
obtaining an actual position of a first alignment feature of the substrate, in a frame of reference of the inkjet printer, based on a wide-area image of the first alignment feature;
positioning an imaging device based on comparing the actual position of the first alignment feature with an expected position of a second alignment feature of the substrate;
acquiring a high resolution image of at least a portion of the second alignment feature using the imaging device;
determining an actual position of the second alignment feature in the frame of reference of the inkjet printer based on the high resolution image;
determining a target position of a print region of the substrate based on the actual position of the second alignment feature;
determining the actual positions of nozzles of a printhead assembly of the inkjet printer based on imaging one or more nozzle surface marks; and
controlling the inkjet printer to eject print material onto the substrate in the print region based on the target position of the print region and the actual positions of the nozzles.

14. The printing method of claim 13, further comprising determining a placement error of the substrate by comparing the actual position of the first alignment feature to an expected position of the first alignment feature, comparing the actual position of the second alignment feature to an expected position of the second alignment feature, or both.

15. The printing method of claim 14, further comprising modifying print data to be used for controlling the inkjet printer to eject print material based on the placement error of the substrate.

16. The printing method of claim 13, wherein the wide-angle image is acquired during a first scan of the substrate on the substrate support in a first direction and the high resolution image is acquired during a second scan of the substrate on the substrate support in a second direction opposite to the first direction.

17. The method of claim 13, wherein the imaging device is a line scan imager.

18. The printing method of claim 13, wherein the print region is a first print region, and further comprising determining a target position of a second print region of the substrate based on the actual position of the second alignment feature.

19. A printing method, comprising:
disposing a substrate on a gas cushion substrate support of an inkjet printer;
obtaining an actual position of a first alignment feature of the substrate, in a frame of reference of the inkjet printer, based on a wide-area image of the first alignment feature;
determining a relationship between an expected position of the first alignment feature and the actual position of the first alignment feature;
positioning an imaging device based on comparing the actual position of the first alignment feature with an expected position of a second alignment feature of the substrate using the relationship;

acquiring a high resolution image of at least a portion of the second alignment feature using the imaging device;

determining an actual position of the second alignment feature in the frame of reference of the inkjet printer based on the high resolution image;

determining a target position of a print region of the substrate based on the actual position of the second alignment feature;

determining the actual positions of nozzles of a printhead assembly of the inkjet printer based on imaging one or more nozzle surface marks; and controlling the inkjet printer to eject print material onto the substrate in the print region based on the target position of the print region and the actual positions of the nozzles.

20. The printing method of claim 19, wherein the imaging device is used to obtain the wide-area image.

* * * * *